United States Patent
Edmonson et al.

(10) Patent No.: US 6,570,462 B2
(45) Date of Patent: May 27, 2003

(54) ADAPTIVE TUNING DEVICE AND METHOD UTILIZING A SURFACE ACOUSTIC WAVE DEVICE FOR TUNING A WIRELESS COMMUNICATION DEVICE

(75) Inventors: Peter J. Edmonson, Hamilton (CA); Colin K. Campbell, Ancaster (CA)

(73) Assignee: Research In Motion Limited, Waterloo (CA)

(*) Notice: Subject to any disclaimer, the term of this patent is extended or adjusted under 35 U.S.C. 154(b) by 5 days.

(21) Appl. No.: 09/867,189

(22) Filed: May 29, 2001

(65) Prior Publication Data

US 2002/0053953 A1 May 9, 2002

Related U.S. Application Data

(60) Provisional application No. 60/246,820, filed on Nov. 8, 2000.

(51) Int. Cl.$^7$ ................................................. H03H 11/30
(52) U.S. Cl. ....................... 333/17.3; 333/150; 455/121; 455/123
(58) Field of Search ......................... 333/17.3, 32, 150; 455/121, 123

(56) References Cited

U.S. PATENT DOCUMENTS

| | | | | | |
|---|---|---|---|---|---|
| 2,742,618 A | * | 4/1956 | Weber | .................... | 333/17.3 X |
| 2,745,067 A | * | 5/1956 | True et al. | ............. | 333/17.3 X |
| 4,015,223 A | * | 3/1977 | Cheze | ....................... | 333/17.3 |
| 4,612,669 A | * | 9/1986 | Nossen | .................. | 333/17.3 X |
| 5,187,454 A | * | 2/1993 | Collins et al. | ............. | 333/17.3 |
| 5,459,440 A | * | 10/1995 | Claridge et al. | ........... | 333/17.3 |
| 5,564,086 A | * | 10/1996 | Cygan et al. | .......... | 333/17.3 X |
| 5,631,611 A | * | 5/1997 | Luu | .......................... | 333/17.3 |
| 5,778,308 A | * | 7/1998 | Sroka et al. | ........... | 333/17.3 X |
| 5,889,252 A | * | 3/1999 | Williams et al. | ........ | 333/17.3 X |

FOREIGN PATENT DOCUMENTS

| | | |
|---|---|---|
| EP | 0 047 354 A1 * | 3/1982 |
| JP | 9-162757 * | 6/1997 |
| JP | 11-88201 * | 3/1999 |

* cited by examiner

Primary Examiner—Barbara Summons
(74) Attorney, Agent, or Firm—Jones Day; Krishna K. Pathiyal, Esq.; Charles B. Meyer, Esq.

(57) ABSTRACT

An adaptive tuning method for a wireless communication device determines the impedance of a matching circuit relative to an impedance to be matched and adjusts the impedance of the matching circuit accordingly. A passive surface acoustic wave (SAW) device includes multiple terminated interdigital transducers (IDTs) which generate reflected SAWs when excited by incident SAWs, each reflected SAW having magnitude and phase characteristics dependent upon the particular IDT termination. According to the invention, the IDT terminations include the impedance matching circuit and the impedance to be matched. Input IDTs in the SAW device are excited with electrical signals, which are converted to generate the incident SAWs. The resultant reflected SAWs are converted by output IDTs into output electrical signal signals which can then be analyzed to determine magnitude and phase differences between the output electrical signal signals and generate an impedance matching circuit control signal based thereon.

42 Claims, 13 Drawing Sheets

ADAPTIVE TUNING DEVICE AND METHOD UTILIZING A SURFACE ACOUSTIC WAVE DEVICE FOR TUNING A WIRELESS COMMUNICATION DEVICE

REFERENCE TO RELATED APPLICATION

This application claims priority from U.S. Ser. No. 60/246,820, filed on Nov. 8, 2000. This prior application, including the entire written description and drawing figures, is hereby incorporated into the present application by reference.

BACKGROUND OF THE INVENTION

1. Field of the Invention

The present invention is directed to the field of antennas used in wireless communication devices and particularly to adaptive tuning of such antennas.

2. Description of the Prior Art

There has been a proliferation in recent years in the field of wireless telecommunications. Items such as cordless and cellular telephones, pagers, wireless modems, wireless email devices, personal digital assistants (PDAs) with communication functions, and other mobile communication devices are becoming commonplace, particularly among individuals who need to be quickly contacted from remote locations. With such devices, it is very important to maintain a clear, strong signal that preserves the integrity of the transmission.

The antennas used with previous wireless communication devices are prone to many significant problems. Some devices, such as pagers and cellular telephones, are usually worn on the person of the user. However, the human body has certain inherent dielectric properties that create an electromagnetic boundary. The boundary conditions of the body of the user change the surrounding impedance, affecting the antenna current distribution and the signal radiation pattern, thus lowering the gain of the antenna by about 4 dB. In this way, the antenna is "detuned". Antenna detuning may also be caused by the presence of certain objects such as metallic bodies and also various ground plane conditions. This effect results in a shorter operating radius and poor in-building performance for some wireless communications devices.

Such boundary effects can be particularly pronounced in modern mobile communication device designs, in which embedded antennas are common. A signal transmitted from or received by an antenna which is integrated into a communication device may encounter several boundaries, including for example a printed circuit board, a battery, a display screen, a device housing, a device carrying case and any of a multitude of other elements or components associated with the device, in addition to a user's body. All such boundaries affect signal propagation and the surrounding impedance seen by the antenna.

Previous devices also suffer from performance problems related to the polarization characteristics of transmission and reception signals. Electromagnetic radiation propagates in any plane and can thus be regarded as having vertical and horizontal polarizations. In order to receive a strong signal, an antenna must be property aligned with the polarization plane of the incoming signal. However, when a mobile device is in operation, it may be turned in all different directions and may not be optimally aligned to receive an incoming signal. In a two-way device, transmissions from the device can be affected by a similar problem. Known device antennas incorporate a loop design, which is nominally effective at implementing the two polarizations but suffers from low gain and low bandwidth. Boundary sources also affect the reception of a polarized signal.

At least a portion of the signal power losses associated with antennas in wireless devices is due to signal reflection. Ideally, all of the signal power of a signal input to an antenna should be converted into an output signal. In reference to FIG. 1, all of the power in a signal generated by a communication unit 12 in a wireless communication device 10 and input to an antenna 16 through a line 14 would ideally be radiated out into the air by antenna 16. A communication signal received over the air by antenna 16 would similarly be converted into a received signal and input to the communication unit 12. However, in reality the characteristic impedance of the communication unit 12 and line 14 interacts with the characteristic impedance of the antenna 16. Unless these impedances are equal, some signal reflection will occur at the interface between line 14 and antenna 16.

One known method of addressing the above-noted problems is to provide an impedance matching circuit between communication circuitry and an antenna, as shown in FIG. 2. Communication device 20 is substantially the same as device 10, but includes impedance matching circuit 24 in line 14. As will be apparent to those skilled in the art to which the invention pertains, impedance matching circuit 24 will normally be an LC circuit with inductance and capacitance elements connected in any one of a number of standard matching circuit topologies. On the communication unit side of line 14, characteristic impedance is relatively easily determined in accordance with known techniques. For example, line 14 may be a coaxial cable having a standard characteristic impedance of 50 Ω, in which case the impedance matching circuit 24 would be designed and implemented such that the overall impedance of the matching circuit 24, in conjunction with the characteristic impedance of the antenna 16, is also 50 Ω.

A major problem with impedance matching in mobile or other wireless communication systems is that impedance matching circuits are normally calibrated during device manufacture and do not normally provide for adjustments in the field, whereas surrounding impedance affecting antennas is rarely constant. In the example receiver 20, over the air signals transmitted and received by antenna 16 may encounter such dielectric boundaries as the housing of device 20, printed circuit boards on which the communication unit 12 is built, electronic components in the communication unit 12, batteries for powering the device 20, display 18, input device 22 and the body of a device user, all of which will affect the impedance seen by the antenna 16. Such impedances can be estimated, but are dependent upon the orientation of the device with respect to its surroundings. Thus, even the best estimates of impedance matching requirements cannot possibly remain accurate for all device operating conditions.

Another known technique intended to compensate for signal reflection effects is shown in FIG. 3. The device 30 is similar to devices 10 and 20, but includes signal power measurement and amplifier control arrangements in addition to the impedance matching circuit 24. The arrangement shown in FIG. 3 is normally used only in a transmit signal path, as indicated by the illustrated unidirectional connections between components. In FIG. 3, a signal generated in communication unit 12 for transmission from device 30 is amplified by power amplifier 26 and then fed to directional power coupler 28. The transmission signal is split between the impedance matching circuit 24 and a termination 34. A reflected signal induced by the combination of antenna 16 and matching circuit 24 is then fed back to a signal power measurement unit 32, which develops an amplifier control signal. Such conventional arrangements measure only signal magnitude and are not designed or intended to determine signal phase. Since effective antenna and surrounding impedances are dependent upon orientation of the antenna, phase information can be important for accurate impedance matching. Furthermore, instead of correcting the underlying problem causing signal power losses, these conventional systems merely boost signal power so that the signal losses can be tolerated.

Therefore, there remains a need for an improved impedance matching arrangement and technique. According to the invention, surface acoustic wave (SAW) technology is used to determine the magnitude and phase of reflected signals and thereby impedance magnitude and phase in a wireless communication device. The determined magnitude and phase are then used to develop control signals which are advantageously used to adjust components in an impedance matching circuit to thereby provide adaptive tuning in a communication device.

SUMMARY OF THE INVENTION

It is an object of the invention to provide an improved impedance matching method and system which provide for an increased operating radius for a wireless communication device.

A related object of the invention is to provide a wireless communication device with improved performance in physically congested operating environments, such as within buildings.

It is a further object of the invention to provide an impedance matching method and system that render a wireless communication device less sensitive to environmental fluctuations.

The inventive method and system also enable a wireless communication device to operate with less sensitivity to directional position.

According to an aspect of the invention, a method for adaptive tuning in a wireless communication device comprises the steps of determining magnitude and phase differences between impedance of a matching circuit and an impedance to be matched and adjusting the impedance of the matching circuit to compensate the differences.

The determining step preferably comprises the steps of providing a first IDT track comprising a first input IDT configured to produce a SAW output when excited by an electrical input signal, a first output IDT configured to produce an electrical output signal when excited by a SAW input, and a first terminated IDT positioned adjacent to the first input IDT and the first output IDT and configured to produce a SAW output when excited by an electrical input signal and an electrical output signal when excited by a SAW input, providing a first termination circuit connected to the first terminated IDT and causing the first terminated IDT to reflect a SAW toward the first output IDT responsive to a SAW produced by the first input IDT, applying an electrical input signal to the first input IDT to produce a first SAW, and receiving a first electrical output signal produced by the first output IDT in response to a first reflected SAW produced by the first terminated IDT responsive to the first SAW. The first electrical output signal may then be processed to determine impedance magnitude and phase of the first termination circuit. When the first termination circuit is the impedance matching circuit, the determining step may further comprise the step of comparing the impedance magnitude and phase of the first termination circuit with a predetermined magnitude and phase of the impedance to be matched to thereby determine the magnitude and phase differences.

In an embodiment of the invention, the determining step further comprises the steps of providing a second IDT track comprising a second input IDT configured to produce a SAW output when excited by an electrical input signal and a second output IDT configured to produce an electrical output signal when excited by a SAW input, and a second terminated IDT positioned adjacent to the second input IDT and the second output IDT and configured to produce a SAW output when excited by an electrical input signal and an electrical output signal when excited by a SAW input, providing a second termination circuit connected to the second terminated IDT and causing the second terminated IDT to reflect a SAW toward the second output IDT responsive to a SAW produced by the second input IDT, applying an electrical input signal to the second input IDT to produce a second SAW, and receiving a second electrical output signal produced by the second output IDT in response to a second reflected SAW produced by the second terminated IDT responsive to the second SAW.

In such a multiple IDT track embodiment, the first termination circuit may be the impedance matching circuit, the second termination circuit may be a reference circuit having known impedance, and the determining step may then further comprise the steps of frequency down converting the first electrical signal by mixing the first and second electrical output signals to generate a mixed signal and low pass filtering the mixed signal to generate a filtered signal, and processing the filtered signal to determine impedance magnitude and phase of the first termination circuit. The magnitude and phase differences may be determined by comparing the impedance magnitude and phase of the first termination circuit with a predetermined magnitude and phase of the impedance to be matched.

The first input IDT and the first output IDT may comprise a first input/output IDT having first electrical input/output terminals, such that the step of applying an electrical input signal to the first input IDT comprises the step of applying the electrical input signal to the first electrical input/output terminals and the step of receiving a first electrical output signal comprises the step of receiving the first electrical output signal from the first electrical input/output terminals. The second input IDT and the second output IDT may similarly comprise a second input/output IDT having second electrical input/output terminals, such that the step of applying an electrical input signal to the second input IDT comprises the step of applying the electrical input signal to the second electrical input/output terminals and the step of receiving a second electrical output signal comprises the step of receiving the second electrical output signal from the second electrical input/output terminals.

A method according to the invention may further comprise the steps of providing a third termination circuit and switchably connecting either the first termination circuit or the third termination circuit to the first terminated IDT. The first termination circuit may be the impedance matching circuit, the third termination circuit may be the impedance to be matched, and the determining step may further comprise the steps of connecting the first termination circuit to the first terminated IDT, applying an electrical input signal to the first input IDT to produce the first SAW, receiving the first electrical output signal, connecting the third termination circuit to the first terminated IDT, applying an electrical input signal to the first input IDT to produce a third SAW, and receiving a third electrical output signal produced by the first output IDT in response to a third reflected SAW produced by the first terminated IDT responsive to the third SAW. The first and third electrical output signals may then be processed to determine the magnitude and phase differences. Alternatively, the first termination circuit may be the impedance matching circuit, the second termination circuit may be the impedance to be matched, and the determining step comprises the steps of processing the first electrical output signal to determine impedance magnitude and phase of the first termination circuit, processing the second electrical output signal to determine impedance magnitude and phase of the second termination circuit, and comparing the impedance magnitude and phase of the first termination circuit and the impedance magnitude and phase of the second termination circuit to determine the magnitude and phase differences.

When a third termination circuit is to be used, the determining step may instead comprise the further steps of providing a third IDT track comprising a third input IDT configured to produce a SAW output when excited by an electrical input signal and a third output IDT configured to produce an electrical output signal when excited by a SAW input, and a third terminated IDT positioned adjacent to the third input IDT and the third output IDT and configured to produce a SAW output when excited by an electrical input signal and an electrical output signal when excited by a SAW input, providing a third termination circuit connected to the terminated IDT and causing the third terminated IDT to reflect a SAW toward the third output IDT responsive to a SAW produced by the third input IDT, applying an electrical input signal to the third input IDT to produce a third SAW, and receiving a third electrical output signal produced by the third output IDT in response to a third reflected SAW produced by the third terminated IDT responsive to the third SAW.

In a preferred triple-track embodiment, the first termination circuit is the impedance matching circuit, the second termination circuit is a reference circuit having known impedance, the third termination circuit is the impedance to be matched, and the determining step comprises the steps of frequency down converting the first and third electrical output signals by mixing the first and second electrical output signals to generate a first mixed signal, mixing the second and third electrical output signals to generate a second mixed signal and low pass filtering the first and second mixed signals to respectively generate a first filtered signal and a second filtered signal, and processing the first filtered signal and the second filtered signal to determine the magnitude and phase differences.

An adaptive tuning system according to an aspect of the invention comprises a passive SAW device, means for supplying an electrical input signal to excite the passive SAW device, means for processing electrical output signals produced by the SAW device responsive to the electrical input signals to generate a control signal, and an adjustable impedance matching circuit connected to receive the control signal, the impedance of the impedance matching circuit being dependent upon the control signal.

In one embodiment, the passive SAW device comprises a first IDT track, the first track including a first input IDT configured to produce a SAW output when excited by an electrical input signal, a first output IDT configured to produce an electrical output signal when excited by a SAW input, a first terminated IDT positioned adjacent to the first input IDT and the first output IDT and configured to produce a SAW output when excited by an electrical input signal and to produce an electrical output signal when excited by a SAW input, and a first termination circuit connected to the first terminated IDT and causing the first terminated IDT to reflect a SAW toward the first output IDT responsive to a SAW produced by the first input IDT, the magnitude and phase of the reflected SAW being dependent on the first termination circuit. In this embodiment, the first input IDT produces a first SAW in response to an electrical input signal from the means for supplying and the first output IDT produces a first electrical output signal in response to a first reflected SAW produced by the first terminated IDT responsive to the first SAW.

The adjustable impedance matching circuit may be connected as the first termination circuit, and the means for processing may then generate the control signal based on a comparison between the first electrical output signal and a predetermined signal. The predetermined signal is preferably dependent upon an impedance to be matched by the impedance matching circuit.

The passive SAW device may further comprise a second IDT track, the second track including a second input IDT configured to produce a SAW output when excited by an electrical input signal, a second output IDT configured to produce an electrical output signal when excited by a SAW input, a second terminated IDT positioned adjacent to the second input IDT and the second output IDT and configured to produce a SAW output when excited by an electrical input signal and to produce an electrical output signal when excited by a SAW input, and a second termination circuit connected to the second terminated IDT and causing the second terminated IDT to reflect a SAW toward the second output IDT responsive to a SAW produced by the second input IDT, the magnitude and phase of the reflected SAW being dependent on the second termination circuit. The second termination circuit may be an impedance to be matched by the impedance matching circuit. This impedance to be matched may be known or unknown.

The first input IDT and the first output IDT may comprise a single first input/output IDT and the second input IDT and the second output IDT may similarly comprise a single second input/output IDT.

According to a further embodiment of the invention, the first termination circuit is switchably connected to the first terminated IDT in the first IDT track, such that any one of a plurality of different termination circuits may be switchably connected to the first terminated IDT. The plurality of different termination circuits preferably includes the impedance matching circuit and an impedance to be matched by the impedance matching circuit.

In a still further embodiment, the passive SAW device further comprises a third IDT track, the third track including a third input IDT configured to produce a SAW output when excited by an electrical input signal, a third output IDT configured to produce an electrical output signal when excited by a SAW input, a third terminated IDT positioned adjacent to the third input IDT and the third output IDT and configured to produce a SAW output when excited by an electrical input signal and to produce an electrical output signal when excited by a SAW input, and a third termination circuit connected to the third terminated IDT and causing the third terminated IDT to reflect a SAW toward the third output IDT responsive to a SAW produced by the third input IDT, the magnitude and phase of the reflected SAW being dependent on the third termination circuit. The third input IDT produces a third SAW in response to an electrical input signal from the means for supplying, and the third output IDT produces a third electrical output signal in response to a third reflected SAW produced by the third terminated IDT responsive to the third SAW.

In further preferred embodiments of the invention, the system further comprises a frequency down converter, the converter comprising mixers for mixing the first and second electrical output signals and a reference frequency signal to generate a mixed signals and low pass filters for filtering the mixed signals to generate a down converted signals. In such embodiments, the means for processing generates the control signal based on the down converted signals. The reference frequency signal may be supplied by either an oscillator or, in multiple-track embodiments, by one of the IDT tracks.

According to an aspect of the invention, each IDT is configured to operate at a predetermined frequency equal to a frequency at which a communication device sends or receives communication signals. The impedance matching circuit is preferably connected to an antenna of the device.

Communication devices in which adaptive tuning methods and systems according to the present invention may be implemented include, but are in no way limited to, such devices as cordless telephones, mobile communication devices, cellular telephones, wireless modems, hand-held electronic communication devices, pagers and personal digital assistants (PDAs) enabled for communications.

Further features of the invention will be described or will become apparent in the course of the following detailed description. As will be appreciated, the invention is capable of other and different embodiments, and its several details are capable of modifications in various respects, all without departing from the invention. Accordingly, the drawings and description are to be regarded as illustrative in nature and not restrictive.

BRIEF DESCRIPTION OF THE DRAWINGS

In order that the invention may be more clearly understood, preferred embodiments thereof will now be described in detail by way of example, with reference to the accompanying drawings, in which.

DETAILED DESCRIPTION OF PREFERRED EMBODIMENTS

In preferred embodiments of the invention, SAW devices are implemented to generate and reflect acoustic waves which are processed to determine antenna reflection characteristics and produce adaptive tuning control signals responsive thereto. In order to facilitate understanding of the invention, SAW devices are described below before the invention is described in detail.

SAW technology is well known for its excellent radio frequency (RF) performance, low cost and small size. SAW is a passive thin film technology that does not require any bias current in order to function. SAW devices have been used in RADAR and radio applications for many years.

Figure 4:
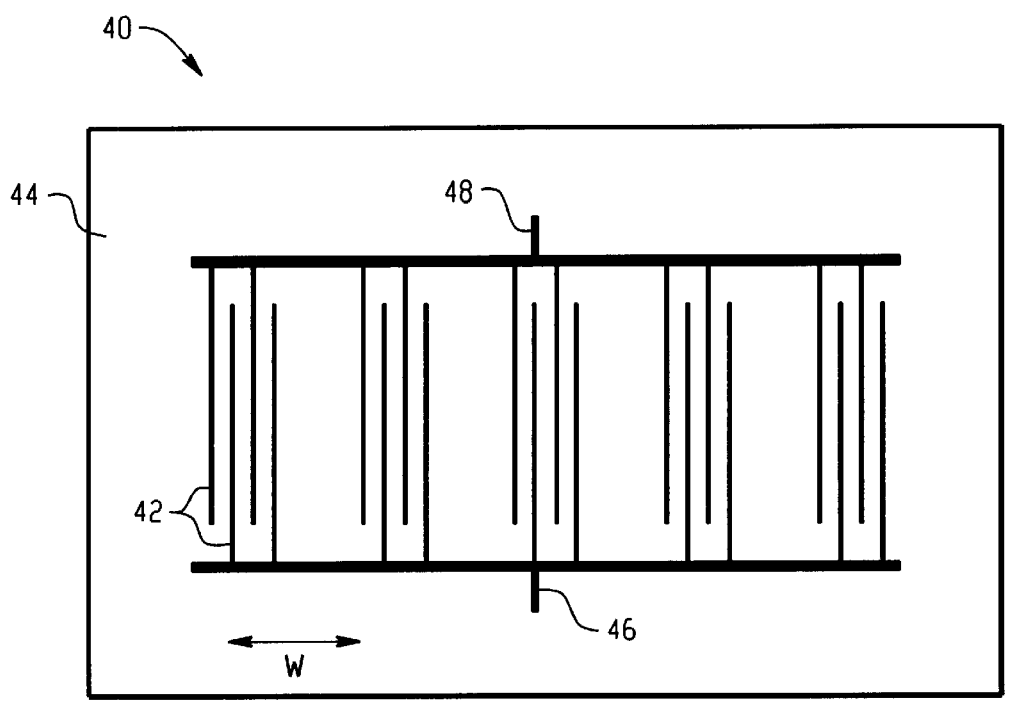
FIG. 4 shows an interdigital transducer (IDT)

The basic "building block" of SAW devices is the IDT such as shown in FIG. 4. An IDT 40 is a series of thin metal strips or "fingers" 42 fabricated on a suitable piezoelectric substrate 44. One set of fingers is connected to a terminal 46, while the opposite set of fingers is connected to another terminal 48. In single-ended IDTs, one terminal is grounded. For differential input signals both terminals 46 and 48 are input/output terminals. Spacing "W" between IDT segments is adjusted to conform to a desired chip period of the sequence of fingers 42. When excited by an electrical signal at a terminal 46 for example, the IDT generates an output SAW which propagates in both directions perpendicular to the fingers 42. If a SAW impinges on the fingers 42, then an electrical signal is generated at terminal 46. These abilities of SAW exciters and converters are well known in the prior art, having been demonstrated for example in C. K. CAMPBELL, *Surface Acoustic Wave Devices for Mobile and Wireless Communications,* Boston, Mass.: Academic Press, 1998.

Figure 5:
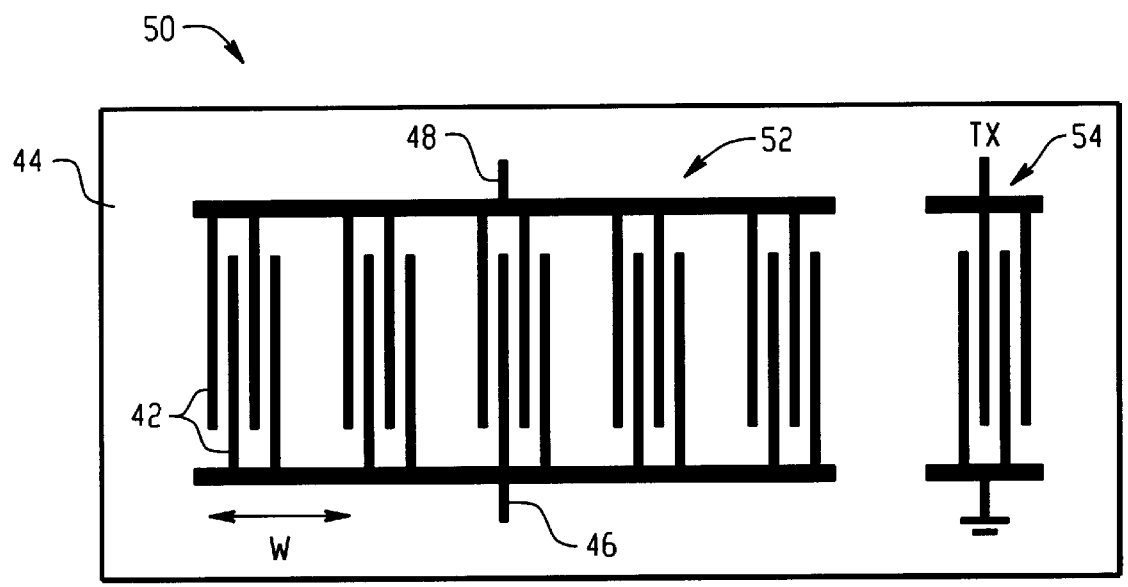
FIG. 5 is a diagram of a SAW-based IDT transmitter.

Thus the structure shown in FIG. 4 can operate as both a SAW exciter, generating a SAW output from an electrical signal input, and a SAW converter, generating an electrical signal output from a SAW input. Terminal 46 in the above example, as well as terminal 48 in differential IDTs, is both a signal input terminal and a signal output terminal. Conversion of an output SAW into an electrical signal for further processing and/or subsequent transmission through an antenna is accomplished by adding a second IDT 54, aligned with the IDT 52, as shown in FIG. 5. Both IDTs can be fabricated on the same substrate 44. A SAW output from IDT 52 is converted into an electrical signal by TX IDT 54. A SAW receiver would have the same structure as in FIG. 5. A signal input to a receive IDT from receiver processing circuitry or an antenna would be converted to a SAW which is input to IDT 52. Like the IDT 52, the TX IDT 54 may be a differential IDT, wherein the grounded lower terminal would be a signal output terminal.

Figure 6:
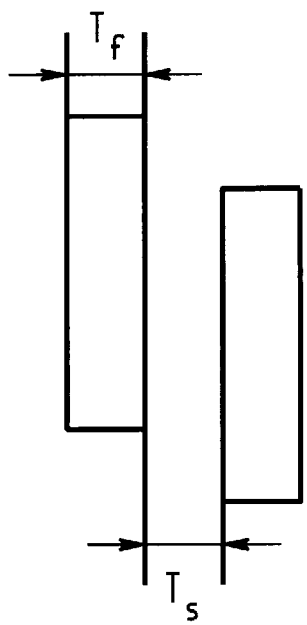
FIG. 6 is an illustration of typical finger geometry in an IDT.

The geometry of adjacent IDT fingers 42 is shown in FIG. 6, where Tf is the width of a metallized finger 42 and Ts is the width of the space between the fingers 42. In typical designs both Tf and Ts are equal to a quarter of a wavelength, λ/4. Since wavelength is inversely proportional to frequency of operation, higher frequency IDTs require thinner fingers 42 located in close proximity to each other, which complicates fabrication and reduces fabrication yields. For example, for a typical SAW system operating in the Industrial, Scientific and Medical (ISM) band at 2.4 GHz the λ/4 dimension could be in the order of 0.425 microns, depending upon the substrate chosen. If such high operating frequencies are desired, second harmonic SAW devices may be used. Such second harmonic devices are disclosed in co-pending U.S. patent application Ser. No. 09/863,944, entitled "A Wireless Communication System using Surface Acoustic Wave (SAW) Second Harmonic Techniques", filed concurrently herewith and assigned to the assignee of the present invention. The subject matter disclosed in the above application is incorporated into the description of the instant application by reference.

Figure 7:
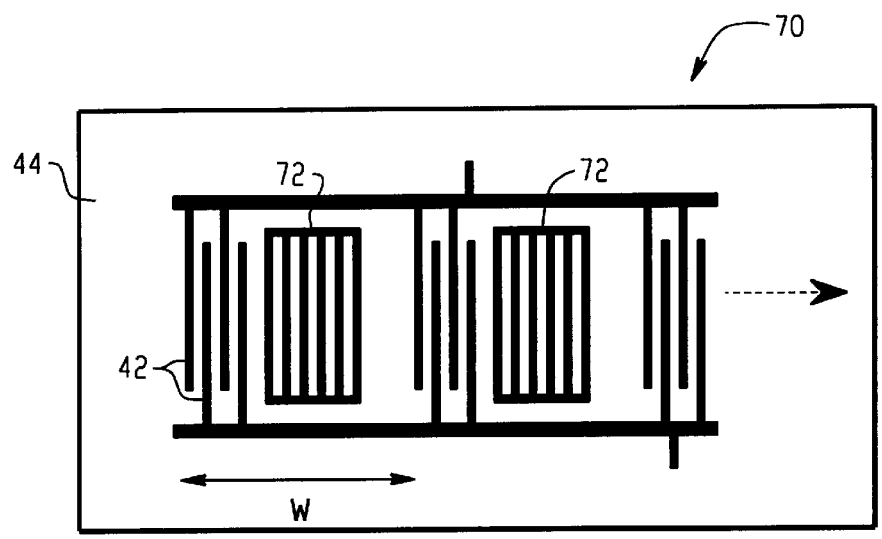
FIG. 7 is a SPUDT-type IDT.

SAW devices used in accordance with the instant invention may also be of a single-phase unidirectional transducer (SPUDT) type, shown in FIG. 7. The primary difference between the basic IDTs shown in FIG. 4 and the SPUDT-type device shown in FIG. 7 is that SPUDT-type SAW devices include reflector gratings 72. The dimension for each finger 42, space and reflector 72 is λ/4 (see for example Chapter 12 of the above referenced publication by C. K. CAMPBELL).

In comparison to the IDT 40 shown in FIG. 4, the SPUDT 70 operates in a similar fashion to produce a SAW in response to an electrical signal at one of its terminals. Each set of fingers 42 produces a SAW that propagates in both directions perpendicular to the fingers. However, the reflector gratings 72 in SPUDT 70 reflect any SAWs impinging thereon and propagating in a direction from the right hand side to the left hand side of FIG. 7 in the opposite direction, from left to right. The spacing of reflector gratings 72 and fingers 42 prevents destructive interference between the reflected waves and waves produced by the fingers 42 which propagate in the desired direction. For optimum performance, the SPUDT reflector gratings are placed judiciously with respect to adjacent sets of fingers 42. This placement selection is dependent on whether the reflection gratings are open- or short-circuited, as well as on the piezoelectric substrate type involved.

The SPUDT 70 outputs a much higher power SAW propagating in the direction indicated by the arrow in FIG. 7. The "right to left" SAW produced by the leftmost set of fingers 42 in FIG. 7 is the only SAW component which does not contribute to the SAW output in the indicated direction. In the transmitter of FIG. 5, roughly only half of the total signal power generated in the IDT 52 propagates toward the TX IDT 54. The SPUDT-type device in FIG. 7 may be either single-ended, with one grounded terminal, or differential, wherein both terminals would be connected as input/output terminals. SPUDT-type SAW devices are disclosed in detail in co-pending U.S. patent application Ser. No. 09/864,507, entitled "A Wireless Communication System using Surface Acoustic Wave (SAW) Single-Phase Unidirectional Transducer (SPUDT-type) Techniques", filed concurrently herewith, assigned to the assignee of the instant invention, and incorporated herein by reference. A SPUDT-type IDT 70 would provide for operation of the invention with lower input power relative to input power requirements of a non-SPUDT-type IDT such as IDT 52.

Figure 8:
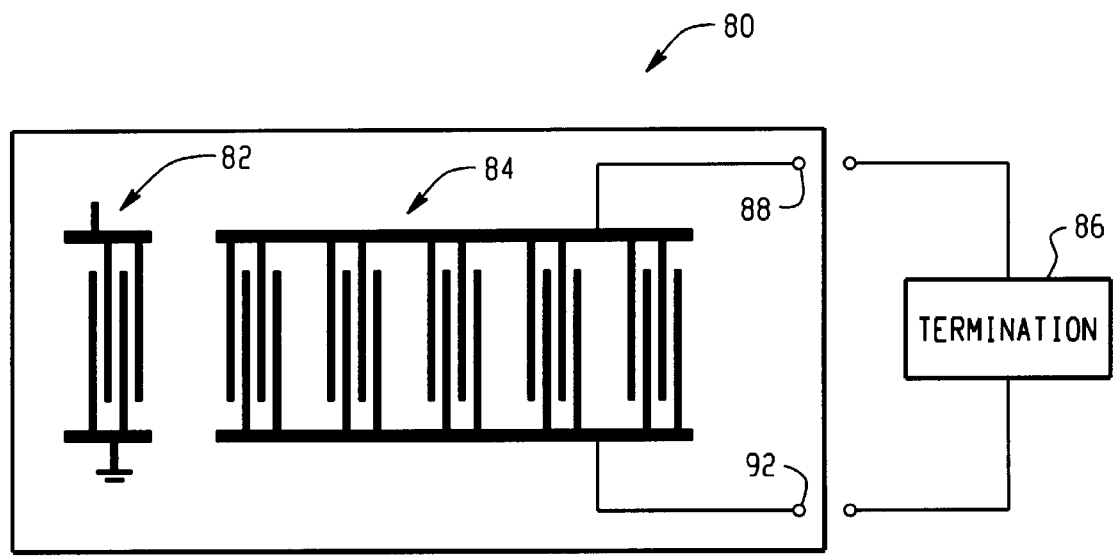
FIG. 8 is a diagram useful in explaining termination-dependent SAW reflection.

In the instant invention, passive operating characteristics of SAW devices are exploited. As shown in FIG. 8, such a passive system 80 may comprise two IDTs 82 and 84. An electrical signal input to the IDT 82 excites IDT 82 to produce an acoustic wave. This wave then propagates to IDT 84 that has a termination 86 connected across its terminals 88 and 92. Termination 86 could for example be an open- or short-circuit termination or a known load termination, which will re-excite the IDT 84 to return an acoustic wave back to the IDT 82. The result is that an electrical signal input to IDT 82 excites IDT 84, which then returns a reflected wave back to the IDT 82. The magnitude and phase of the reflected waveform will be dependent upon the termination 86. Although IDT 82 in FIG. 8 is a single-ended IDT, a differential design could also be implemented. Similarly, IDT 84 could be a SPUDT-type IDT.

Figure 9:
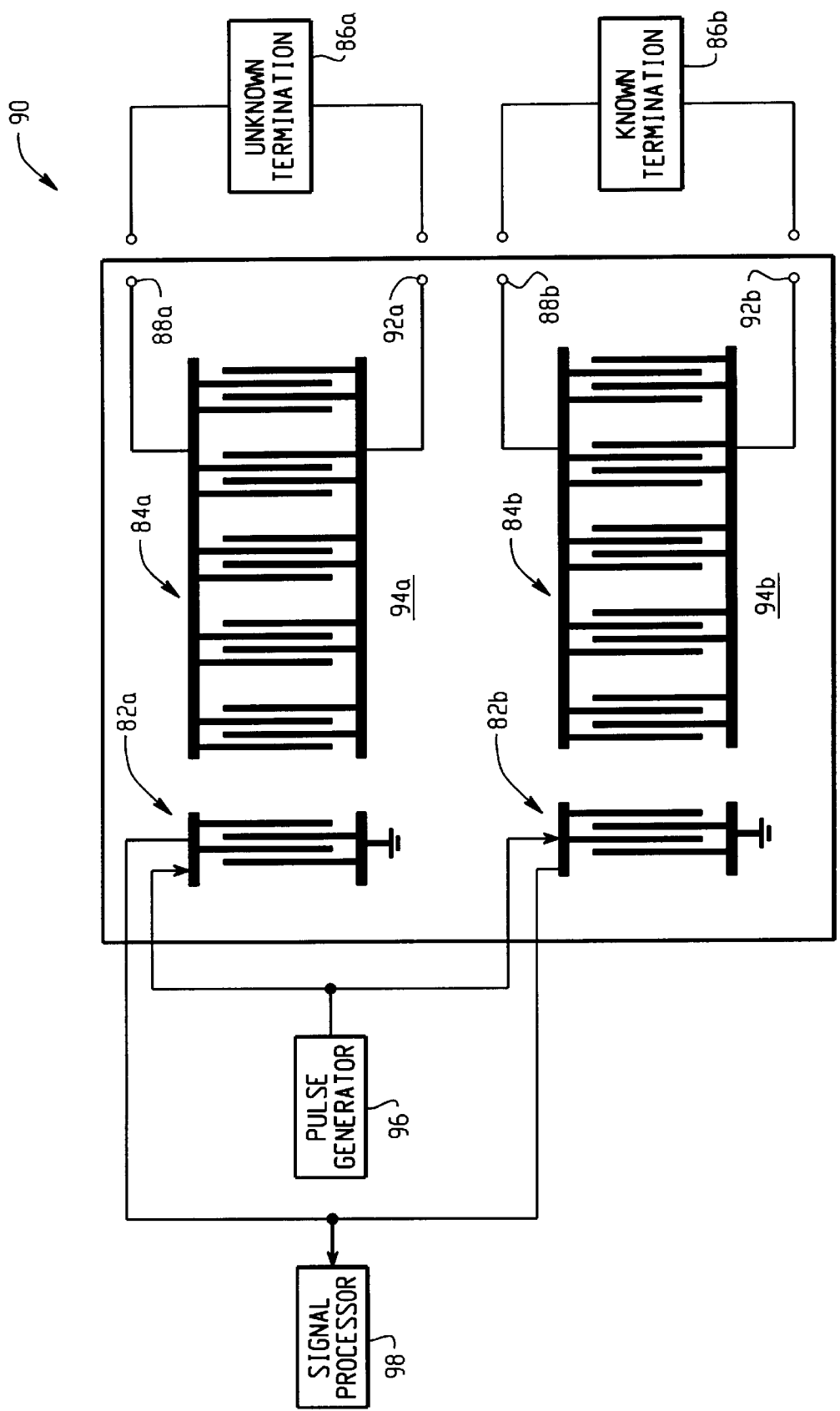
FIG. 9 illustrates an underlying concept of the invention

The general concept of the instant invention is illustrated simply in FIG. 9. The SAW arrangement 90 includes two of the passive devices shown in FIG. 8. Signal generator 96 excites the IDTs 82a and 82b in the passive devices 94a and 94b, which generate respective SAWs propagating toward terminated IDTs 84a and 84b. As discussed above in relation to FIG. 8, termination 86a and 86b re-excite the terminated IDTs to thereby cause reflected SAWs to be returned back to IDTs 82a and 82b. The reflected SAW waveforms impinge on the IDTs 82a and 82b and are converted to electrical signals which can be analyzed by a signal processing module 98. Since termination 86b is known, the magnitude and shape of the reflected SAW induced thereby will also be known. By comparing the known and unknown SAW waveforms, or in the example arrangement 90, electrical versions of the known and unknown SAW waveforms, both the phase and magnitude of the unknown SAW and thereby the unknown termination may be determined.

In the context of the above-discussed impedance matching problems, such a SAW-based arrangement as shown in FIG. 9 provides a simple, small, low-cost and low-power means for measuring the impedance seen by an antenna in a communication device. Based on accurately determined impedance magnitude and phase values, in accordance with the invention, an impedance matching circuit is adjusted, thereby providing adaptive tuning as discussed further below.

Figure 10:
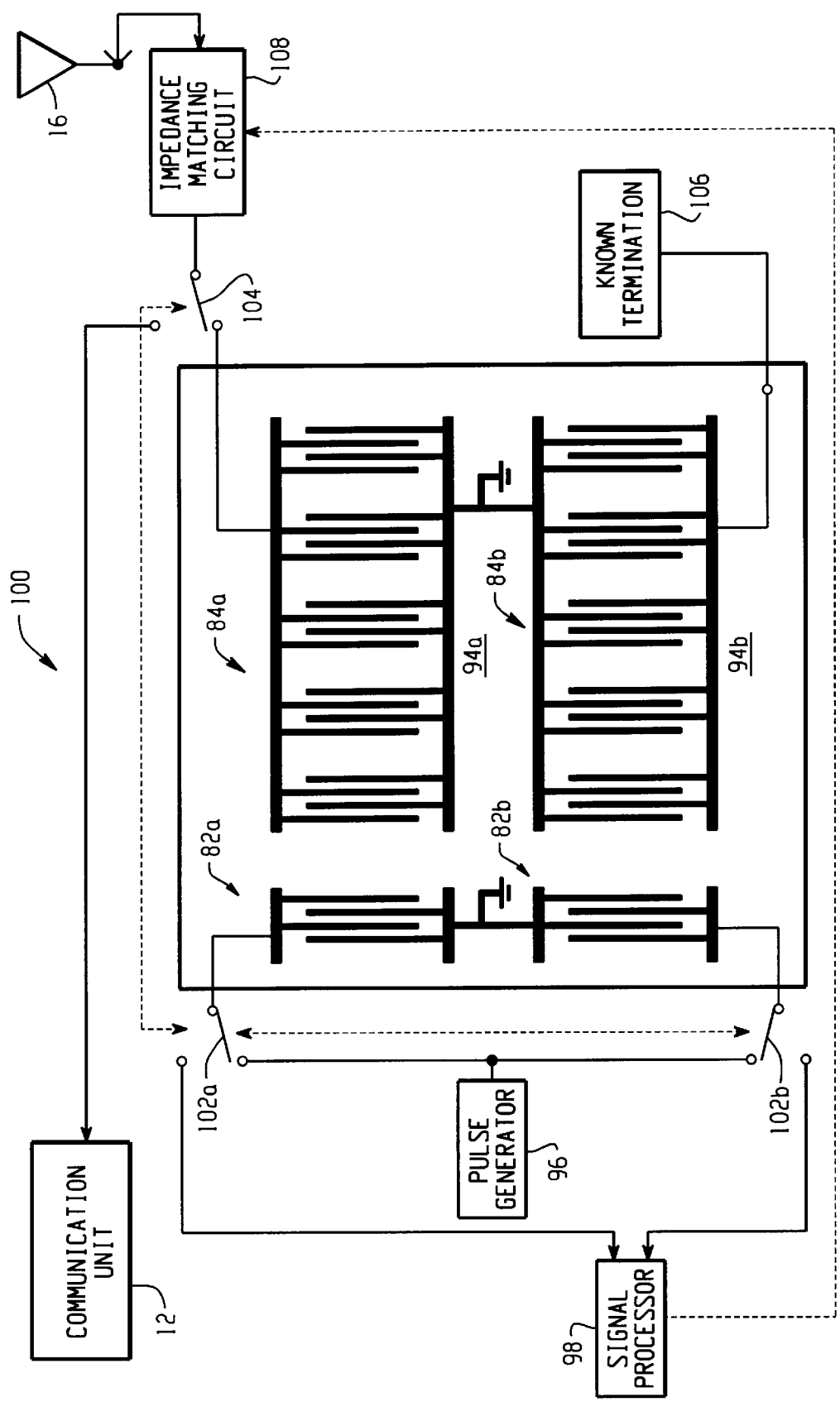
FIG. 10 is a diagram of a communication device according to a first embodiment of the invention.

SAW devices may be implemented in a wireless communication device in accordance with a first embodiment of the invention as shown in FIG. 10. In order to maintain clarity, non-essential details of the communication device are omitted from FIG. 10 and subsequent drawings. Although not explicitly shown in the drawings, it is to be understood that the communication device may include such elements as the display 18 and input device 22.

Figure 1:
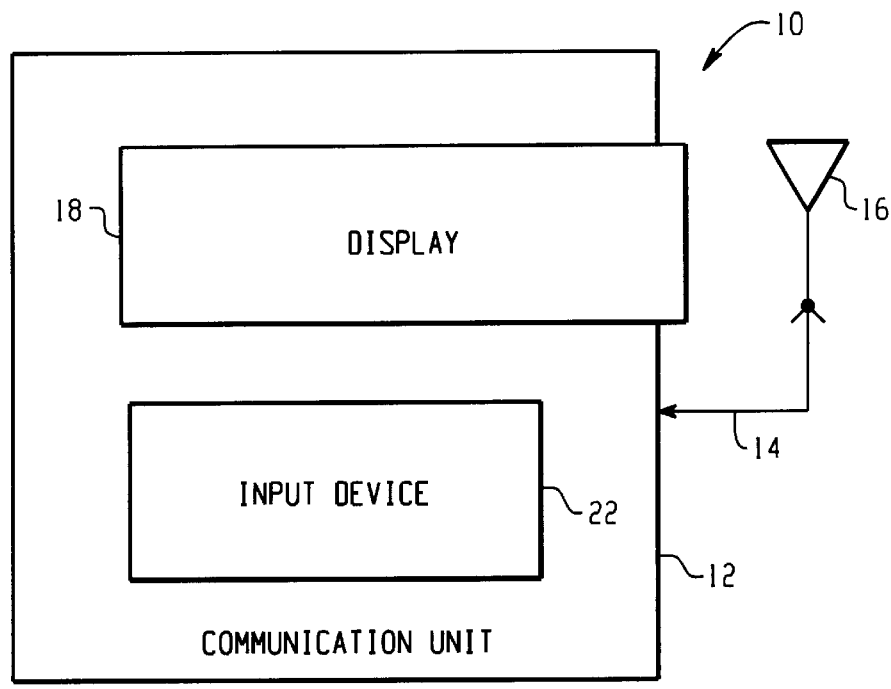
FIG. 1 is a simple block diagram of an example known wireless communication device.
Figure 2:
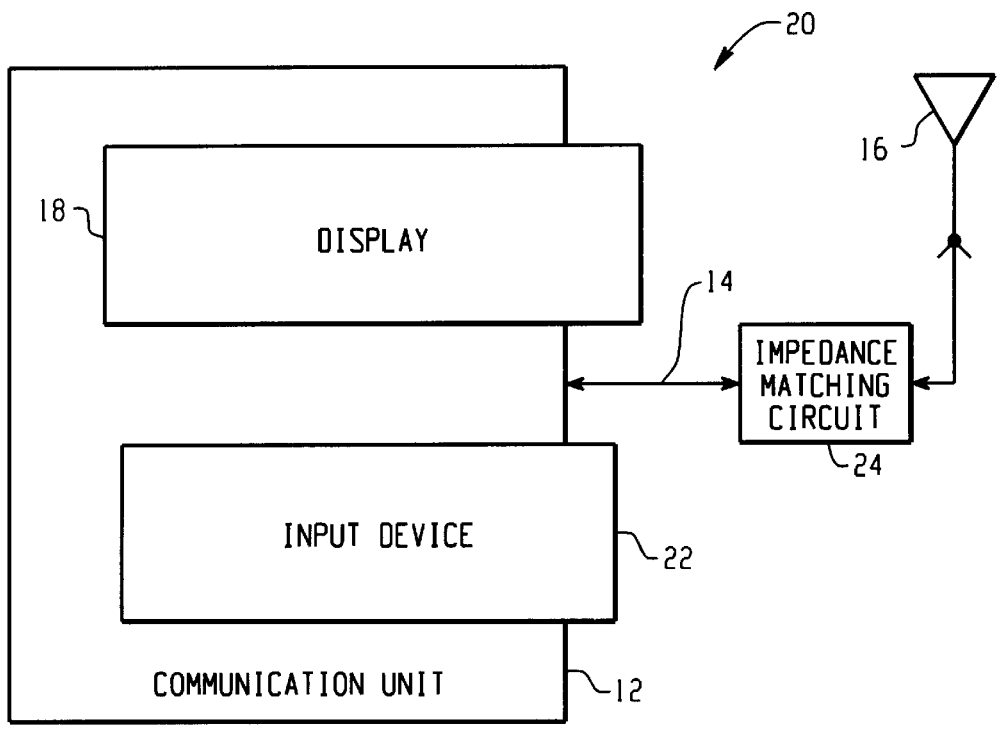
FIG. 2 is a block diagram of a communication device similar to the device in FIG. 1, including an impedance matching circuit.
Figure 3:
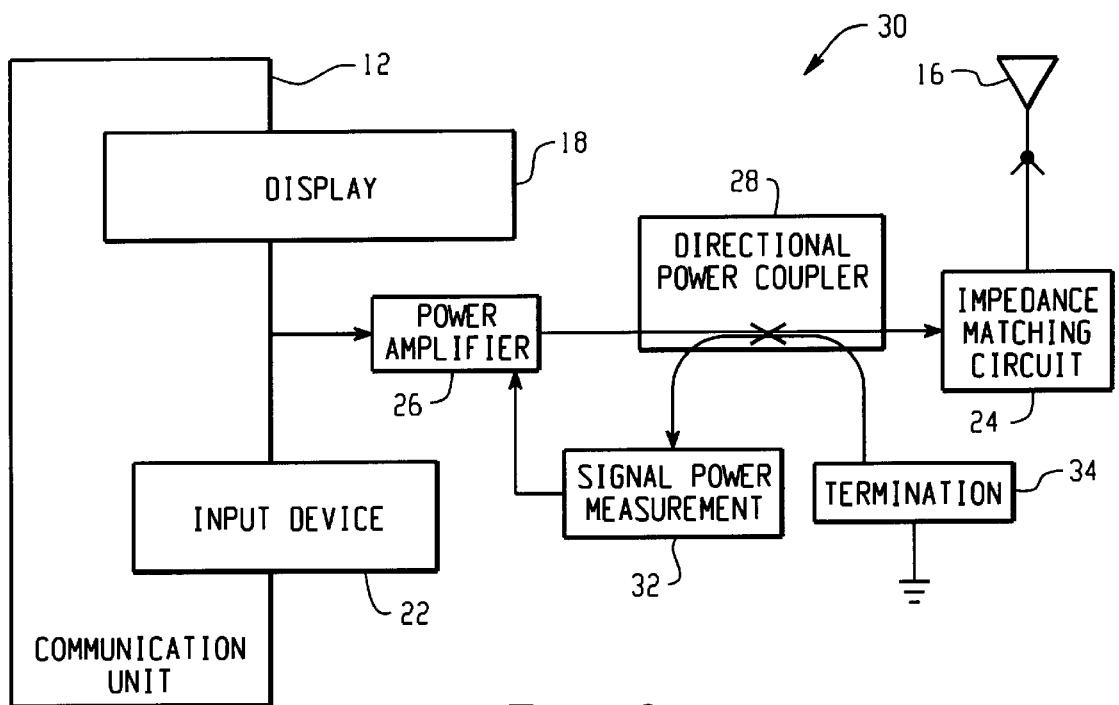
FIG. 3 shows a communication device similar to the device in FIG. 2, including a reflected signal measurement arrangement.

Referring now to FIG. 10, communication device 100 includes a communication unit 12, which generates communication signals for transmission over the air through antenna 16 and processes communication signals received over the air through antenna 16, as discussed above. Impedance matching circuit 108 is similar to the matching circuit 24 in FIGS. 2 and 3, but includes at least one adjustable impedance element such as a varactor.

In device 100, switch 104 is normally in the upper position, connecting communication unit 12 to antenna 16 through impedance matching circuit 108 to thereby provide for normal operation of the communication device 100. Since the SAW device is not connected to the matching circuit 108 and antenna 16, the positions of switches 102a and 102b are not critical. During normal receiver operation, switches 102a and 102b may connect the SAW device to either the signal generator 96, to the signal processor 98 or possibly to a grounded terminal (not shown). Regardless of the 'idle' positions of switches 102a and 102b, in accordance with the invention, switches 102a, 102b and 104 are controlled to intermittently assume a SAW signal state, in which switches 102a and 102b connect signal generator 96 to SAW devices 94a and 94b and switch 104 connects SAW device 94a to impedance matching circuit 108 and antenna 16. Signal generator 96 then generates an electrical signal which is input to IDTs 82a and 82b. Immediately after the electric signal is generated by signal generator 96, switches 102a and 102b are switched to connect SAW devices 82a and 82b to the signal processor 98.

As discussed in conjunction with FIG. 9, an electric signal from signal generator 96 is converted into SAWs in identical IDTs 82a and 82b, the SAWs are converted back into an electric signal by identical IDTs 84a and 84b, and reflected SAWs dependent upon the terminations of devices 84a and 84b are returned to IDTs 82a and 82b. IDTs 82a and 82b are excited by the reflected SAWs returned by IDTs 84a and 84b and convert the acoustic waves back into electric signals. The reflected wave returned by IDT 84b will be known, as a known termination 106 with known reflection characteristics is connected thereto. The magnitude and phase of the reflected SAW returned by IDT 84a, which will be proportional to the unknown termination of matching circuit 108 and antenna 16, relative to the magnitude and phase of the known reflected SAW, can thus be determined by comparator and signal processor 98. Switch 104 is returned to its normal upper position after a predetermined time delay following the switching of switches 102a and 102b to connect the SAW devices 82a and 82b to the signal processor 98. The predetermined delay is sufficient to provide for reflection of the SAW by IDT 84a back to IDT 82a.

For practical implementation of the adaptive tuning arrangement in device 100, the signal processor 98 could be a digital processing module, comprising computer software code in a digital signal processor (DSP) for example. The signal processor 98 could also generate control signals to control the operation of signal generator 96 and switches 102a, 102b and 104, as will be apparent to those skilled in the art. However, digital domain processing requires analog to digital conversion of the SAW device outputs. In contemplated embodiments of the invention, the passive SAW devices 94a and 94b would be designed to operate at frequencies on the range of several hundred MHz. In a particularly preferred embodiment of the invention, the SAW devices would operate at the frequency of a communication channel used by the communication device to provide for accurate determination of the effective impedance of matching circuit 108 and antenna 16 under actual device operating conditions. For a wireless communication device operating on the Mobitex™ wireless communication system, the passive SAW devices could be designed to operate at frequencies on the order of 900 MHz, at or near one of the actual transmit or receive channels. Such high operating frequencies would normally require frequency down conversion in the signal processor 98 prior to analog to digital conversion.

Figure 11:
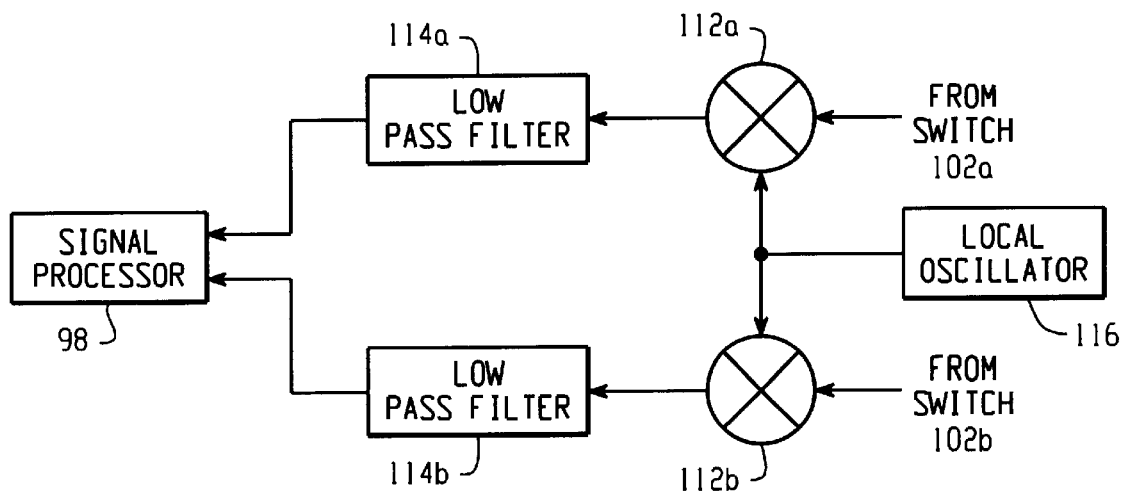
FIG. 11 is a block diagram of a down conversion arrangement.

This could possibly be accomplished with a typical down converter including a local oscillator or other frequency synthesizer, a mixer and low pass filter, as known in the art and shown in FIG. 11. Such a down conversion scheme would require dual down converters, each having a mixer 112a or 112b and a low pass filter 114a and 114b, sharing a local oscillator 116 or other frequency synthesizer. A reference frequency signal for such down converters could possibly be an output of, or derived from an output of, an oscillator or frequency synthesizer in communication unit 12. Also, since the reflected SAW from IDT 84b has a known shape, a digital representation of a down converted version of the known electrical signal could be stored in signal processor 98, such that only the output from the IDT 84a, with the unknown termination, need be down converted. In applications of the invention where implementation of a down converter such as in FIG. 11 is feasible and a stored version of the known signal is available to the signal processor 98, the second passive SAW device 94b would not be required.

Figure 12:
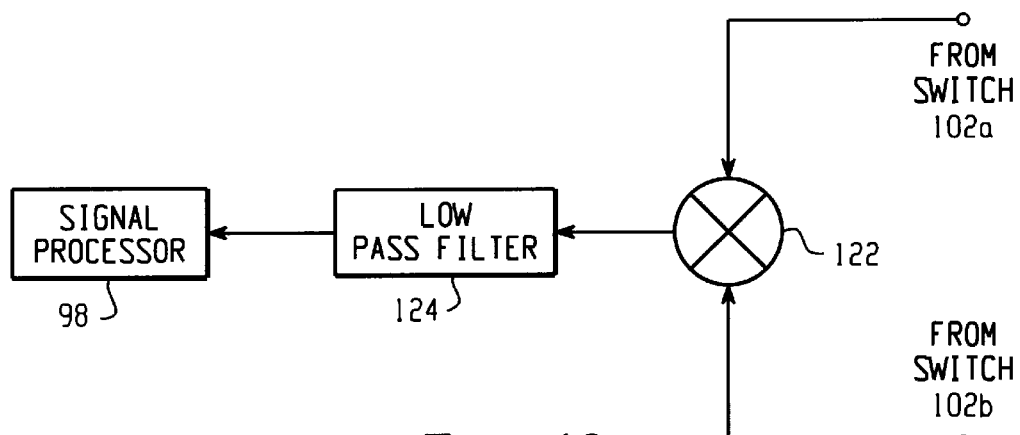
FIG. 12 shows a second down conversion arrangement.

In the invention however, the dual IDT tracks 94a and 94b are preferred, and provide for simple down conversion of the passive SAW device outputs to baseband frequency. As shown in more detail in FIG. 12, the outputs from the two IDT tracks can be input to a mixer 122 and low pass filtered (124) to produce a baseband-frequency signal. The down conversion is thus accomplished without a local oscillator or frequency synthesizer. The output of filter 124 can then be further processed to determine magnitude and phase differences between the known termination and the unknown termination of matching circuit 108 and antenna 16. In the embodiment of FIG. 12, the signal processor 98 must store magnitude and phase information relating to the SAW reflection characteristics of the known termination and IDT 94b in order to determine magnitude and phase differences from the mixed signal output from filter 124. The IDT track 94b, terminated with the known termination 106, acts as a local oscillator to generate a reference signal used in down converting the unknown signal to baseband. Since the IDTs are small, passive devices and require no standby power, the FIG. 12 arrangement can be particularly advantageous in communication devices with a battery or otherwise limited power supply.

The known termination 106 may for example be the characteristic impedance of the communication unit 12, which is normally relatively stable and easily determined. For the above example of a coaxial line connecting the communication unit 12 to impedance matching circuit 108, the known termination may be a 50 Ω resistance. When the characteristic impedance of the communication unit is used as known termination 108, magnitude and phase differences between the known and unknown reflected SAWs are representative of any difference between the characteristic impedance and the actual overall impedance of the matching circuit 108 and antenna 16. Based on such differences, the signal processor 98 can then generate an appropriate control signal for the impedance matching circuit 108. However, the invention is in no way restricted to any particular values of the known termination 106. The termination 106 could also be an open- or short-circuit termination or any other termination for which SAW reflection characteristics are known.

In accordance with the invention, the above adaptive tuning process could be initiated in any of a number of ways. For example, tuning could be performed either (i) periodically, (ii) when requested by a user of a communication device, or (iii) on the basis of a different predetermined event, such as immediately following a channel detection operation or at the end of a communication signal reception. The inventive tuning process could also be invoked by the communication device or a serving base station dependent upon the signal quality of a communication signal received by either the device or the base station. Regardless of the chosen scheme for invoking the inventive adaptive tuning operation, communication processing should take precedence. In the case of device- or base station-requested tuning during a communication operation, timing of the tuning operation would be negotiated between the base station and the device, to avoid errors due to communication signal interruptions and delays caused by such tuning during communication.

Although device 100 includes single-ended IDTs, differential passive SAW arrangements are also contemplated. The implementation of either a single-ended or differential SAW design will depend upon the particular communication device.

Figure 13:
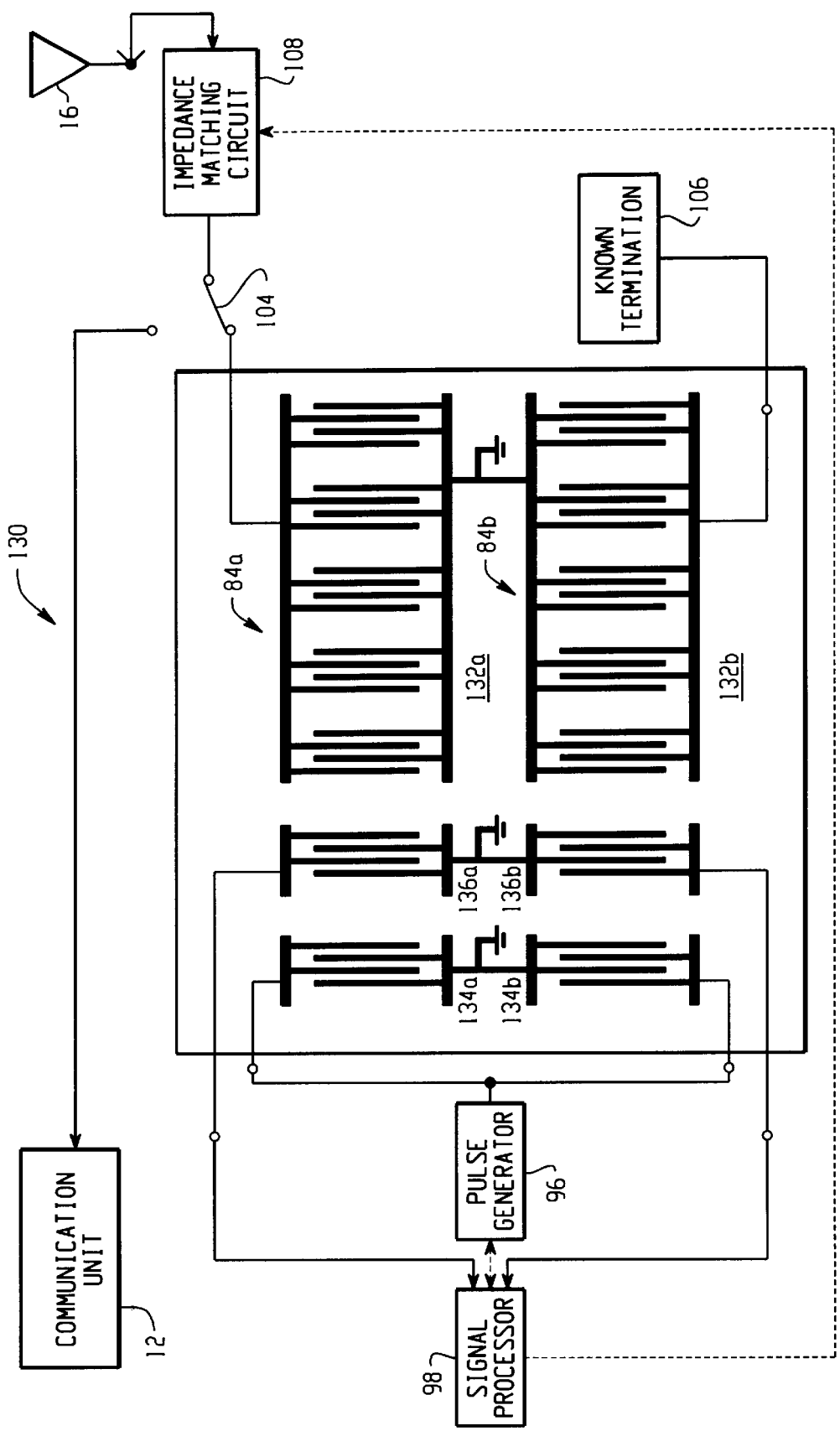
FIG. 13 is a block diagram of a communication device in accordance with a second embodiment of the invention.

FIG. 13 shows a second embodiment of the invention, in which controlled switches 102a and 102b are not required. Device 130 is substantially the same as device 100 and operates similarly thereto, but includes separate input IDTs 134a and 134b and output IDTs 136a and 136b. As described above, a signal input to IDTs 134a and 134b is converted into SAWs, which excite IDTs 136a, 136b, 84a and 84b. Reflected SAWs from IDTs 84a and 84b impinge upon IDTs 136a and 136b, which convert the reflected SAWs into output signals. The signal processor 98 operates as above to determine the impedance of the unknown matching circuit/antenna termination relative to the known termination. Thus the operation of the dual track passive SAW system in device 130 is similar to the SAW system in device 100.

In the absence of switches 102a and 102b however, operation of the signal generator 96 and signal processor 98 must be coordinated such that the signal processor 98 processes only the reflected SAWs. When the input IDTs 134a and 134b are excited by an input signal from signal generator 96, the resultant SAWs will impinge upon the output IDTs 136a and 136b, which will generate output signals. According to the invention, only the electrical outputs resulting from the reflected SAWs should be processed. Therefore, signal processor 98 must delay its processing operations until the reflected SAWs have been converted by output IDTs 136a and 136b. This may be accomplished for example by connecting processor 98 to receive the input signals from signal generator 96. Alternatively, the signal generator 96 may be controlled by processor 98. In both these examples, the processor 98 will be aware of the operation of the signal generator 96 and delay its operation accordingly to ensure that the reflected SAWs, not the original SAWs from input IDTs 134a and 134b, are processed. Other arrangements for coordinating the operation of signal generator 96 and processor 98 may also be apparent to those skilled in the art. The outputs from output IDTs 136a and 136b may be connected as shown in either FIG. 11 or FIG. 12 for down conversion to facilitate digital signal processing.

In the above embodiments of the invention, it is assumed that the impedance of the communication unit 12, which is the impedance to be matched by the combination of the antenna 16 and matching circuit 108, is known. As described above, although the known termination 106 need not necessarily be this communication unit impedance, the relationship between the known termination 106 and the impedance of communication unit 12 must be known. As also discussed above, when a down conversion arrangement as shown in FIG. 12 is preferred, the processor must have access to stored magnitude and phase information relating to the reflection characteristics of the input/output IDT 82b in FIG. 10 or output IDT 134b in FIG. 13 connected to the known termination 106.

As will be apparent to those skilled in the art, the impedance of communication unit 12 cannot possibly be measured for every communication device in a mass production environment. An impedance estimate will normally be determined from a representative sample of such devices. In the above embodiments of the invention, impedance matching circuit adjustments are based on this fixed, estimated communication unit impedance. Depending upon the specific communication device, its components and its expected range of operating conditions, the assumption of constant communication unit impedance may not be valid. For example, physical stress on the communication device and humidity and temperature fluctuations can cause the impedance characteristics of the communication unit 12 to change. Component tolerances will also affect the accuracy of initial communication unit impedance estimates. Therefore, the estimated reference impedance upon which impedance matching circuit adjustments are based may itself be inaccurate. Under such conditions, even ideal operation of the inventive adaptive tuning arrangement to maintain perfect matching between the estimated impedance and the overall effective impedance of the combination of matching circuit 108 and antenna 16 will not provide the desired matching.

Figure 14:
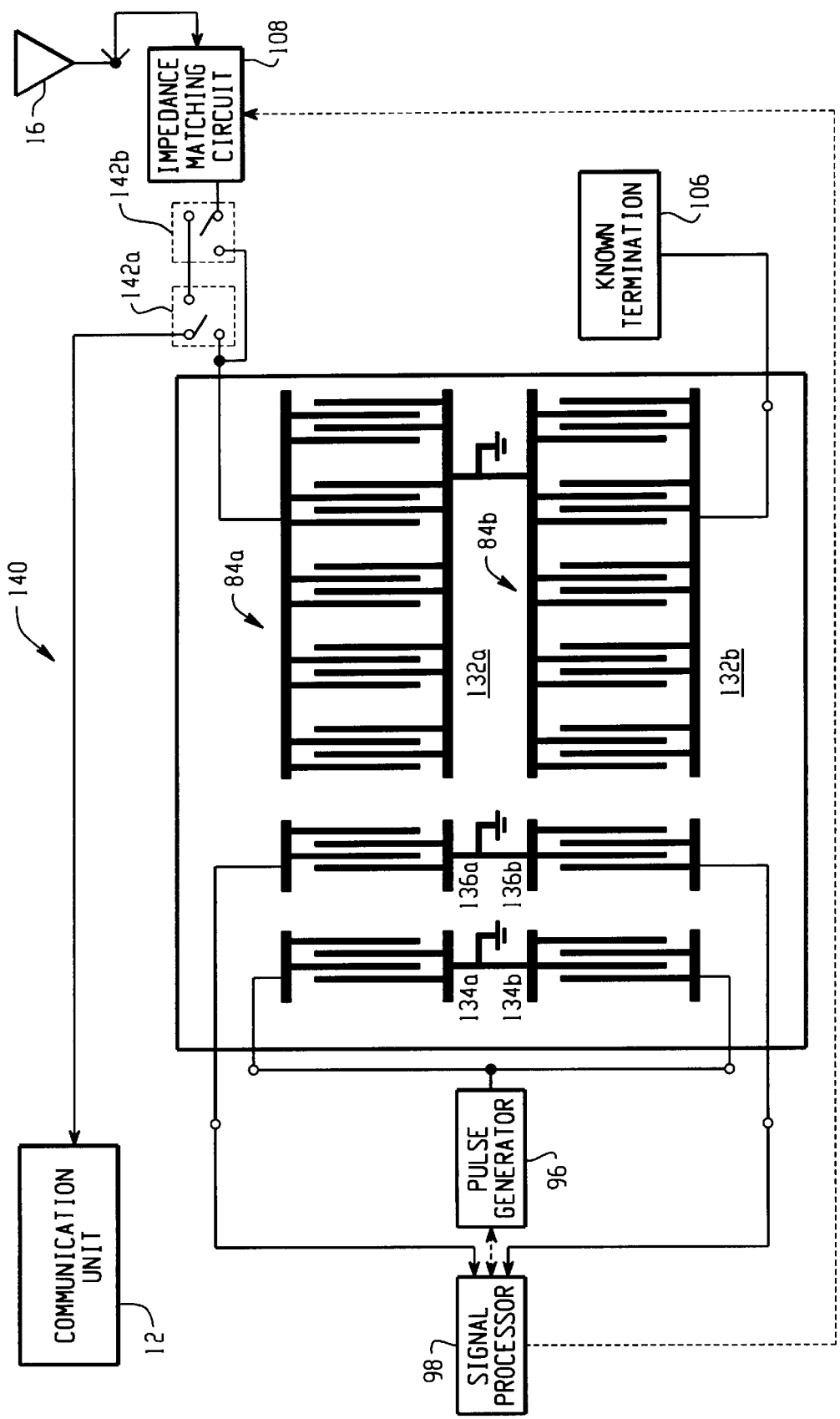
FIG. 14 illustrates a third embodiment of the invention.

In a third embodiment of the invention shown in FIG. 14, the effective impedance of the communication unit 12 can also be determined. Although the passive SAW arrangement in device 140 corresponds to the arrangement in FIG. 13, the switched arrangement of FIG. 10 is also contemplated. The structure of device 140 is primarily the same as device 130, except that device 140 includes two switches 142a and 142b instead of the single switch 104. Switches 142a and 142b normally connect communication unit 12 to matching circuit 108. When tuning of the antenna in accordance with the invention is to be performed, one of the switches 142a and 142b toggles to its opposite position. For example, if the impedance of communication unit 12 is to be determined, switch 142a toggles to connect the communication unit 12 as a termination of IDT 84a. An electrical signal is then input to the passive SAW arrangement as described above and the impedance of communication unit 12 can be determined by processor 98 based on the reflected SAWs. When the impedance of matching circuit 108 and antenna 16 is to be determined, switch 142b operates similarly to switch 104. It should be noted that only one of switches 142a and 142b will be connected to IDT 84a during execution of the adaptive tuning process.

When switch 142a connects the communication unit 12 to IDT 84a, the signal processor 98 operates as described above to determine the impedance of communication unit 12 relative to the known termination 106. When the known termination 106 is the expected impedance of communication unit 12, the signal processor 98 will detect any differences between the actual impedance of the communication unit 12 and the expected impedance, due for example to inaccuracy of the initial impedance estimate or temperature or other environmentally induced variations in communication unit impedance. The processor 98 can then store such differences, representative of an offset between the actual communication unit impedance and the estimated impedance, for use in subsequent adaptive tuning operations. The resultant matching circuit control signals generated by signal processor 98 during such subsequent operations therefore adjust matching circuit 108 to match the actual communication unit impedance, not the estimated impedance.

The timing or scheduling of adaptive tuning operations will be dependent upon the particular communication device and the system in which it is designed to operate. As described above, execution of the inventive tuning method may be triggered by a timeout or by a different communication device process or event. Whether the impedance of communication unit 12 or matching circuit 108/antenna 16 is measured at any particular time will also be dependent upon the device and expected operating conditions and may be either independently or dependently triggered. The impedance of communication unit 12 typically tends to be more stable than that of the matching circuit 108 and antenna 16 and therefore may not need to be determined as often. For example, switch 142*a* might be operated to determine communication unit impedance once every day, whereas matching circuit 108/antenna 16 impedance might be determined every few minutes. A communication unit impedance determination cycle might also be executed if the signal processor 98 detects exact or near exact impedance matching, to ensure that the impedance being matched is accurate. Many more scheduling or triggering schemes will be apparent, all of which are considered to be within the scope of the invention.

Figure 15:
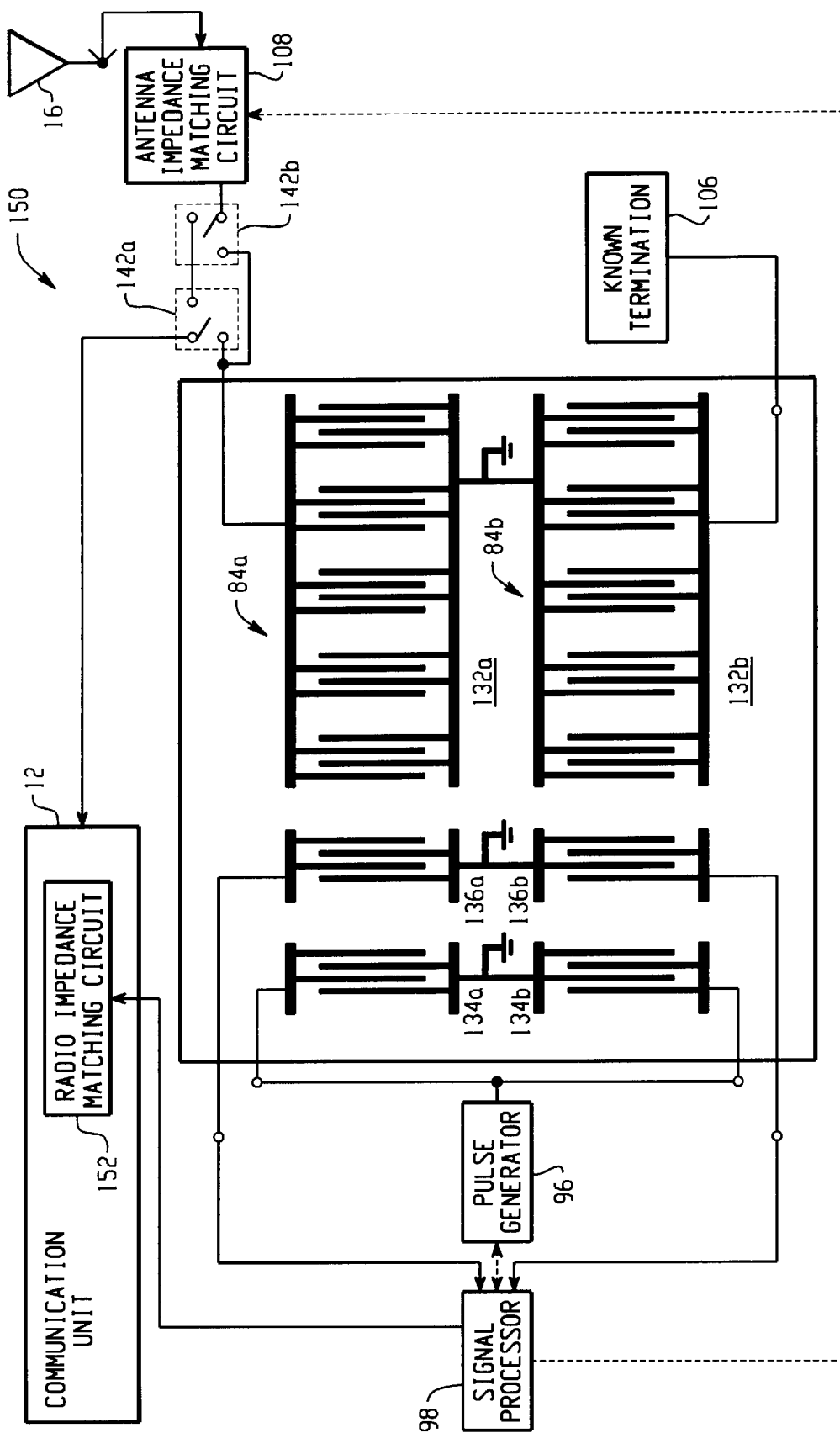
FIG. 15 shows a block diagram of a communication device in which a fourth embodiment of the invention is implemented.

The concept of looking back into the communication unit 12 to determine its effective impedance may be extended to include a further adaptive matching scheme in accordance with a fourth embodiment of the invention, as shown in FIG. 15. As known in the art, modern communication units can include impedance matching circuits such as 152, intended to match the effective impedance of the communication unit or radio 12 to the characteristic impedance of a line connecting the unit to the antenna 16, which according to the above example may be a coaxial cable with characteristic impedance of 50 Ω. Communication device 150 operates in the same way as device 140 described above to determine the impedance of either the communication unit 12 or the matching circuit 108/antenna 16. In this fourth embodiment, processor 98 uses the determined communication unit impedance to generate a control signal which is input to the radio impedance matching circuit 152. Thus, the radio impedance matching circuit 152 is preferably adjusted to match the radio impedance to the known termination 106, or at least to maintain a predetermined relationship between the communication unit impedance and the known termination. Any impedance changes in the communication unit 12 are therefore compensated in matching circuit 152 and should not affect adaptive antenna tuning processing based on the known termination. This dual adaptive tuning arrangement may also be implemented with a switched architecture as shown in FIG. 10. Triggering of the two different adaptive tuning processes may be time- or event-based and dependent or independent.

Figure 16:
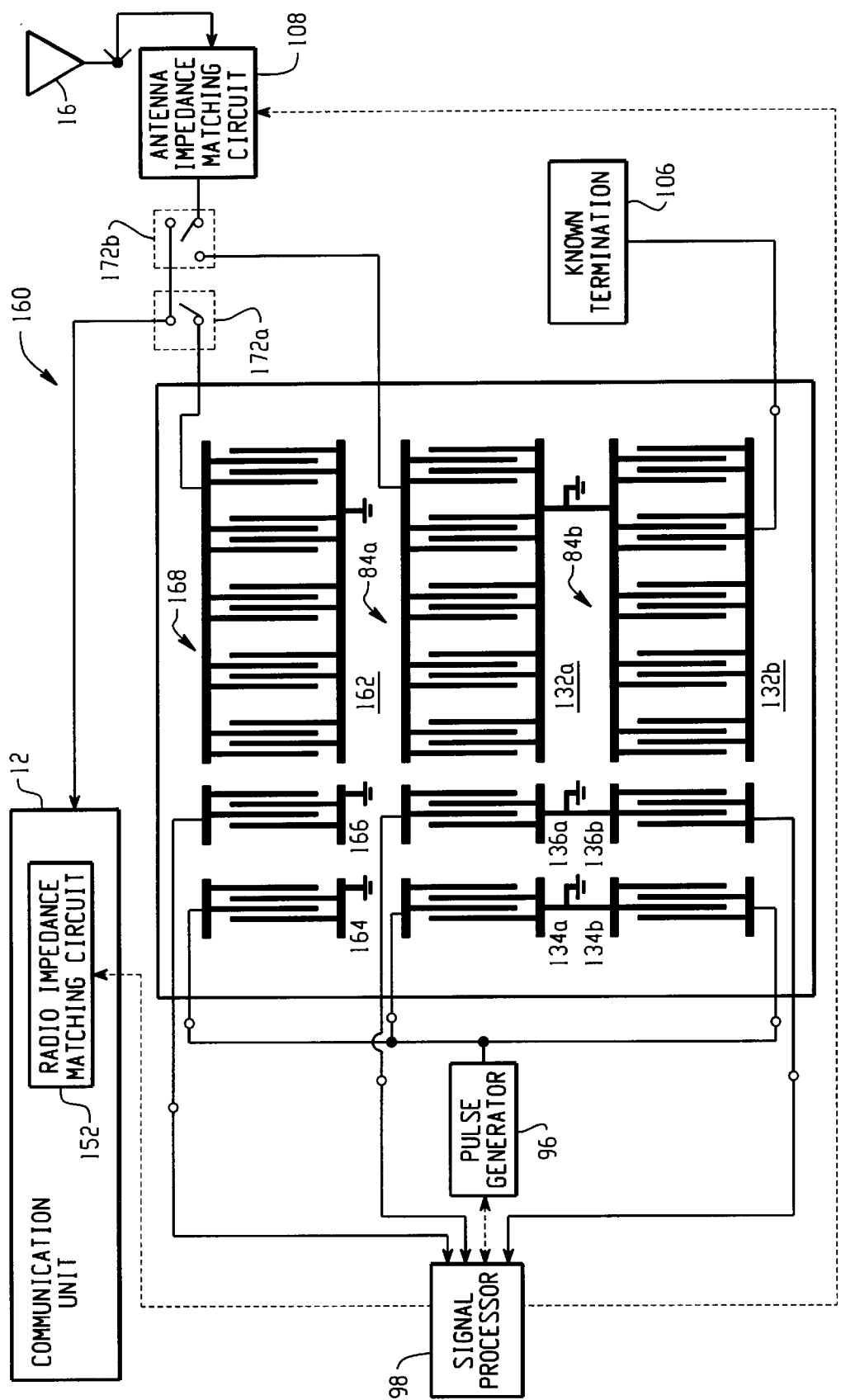
FIG. 16 is a block diagram of a communication device including a fifth embodiment of the invention.

FIG. 16 shows a fifth embodiment of the invention, in which radio and antenna impedances can be measured simultaneously. The device 160 includes three IDT tracks 162, 132*a* and 132*b*, each of which operates as discussed above to generate a SAW from a signal input and to return a reflected SAW from which impedance characteristics of the unknown terminations relative to known termination 106 can be determined and appropriate matching circuit control signals can be generated. Although shown in FIG. 16, the radio impedance matching circuit 152 might not always be provided, depending on the specific implementation of the invention.

In comparison with devices 140 and 150, device 160 includes a simpler switching arrangement. Switch 172*a* is normally open and switch 172*b* normally connects the communication unit 12 to the antenna matching circuit 108. When the inventive adaptive tuning operations are to be performed, switch 172*b* toggles to its other position to connect antenna matching circuit 108 to IDT 84*a*. Switch 172*a* then closes to connect communication unit 12 to IDT 168. Signal generator 96 excites the input IDTs 164, 134*a* and 134*b*, and reflected SAWs are converted into electrical signals in output IDTs 166, 136*a* and 136*b*, as above. Switches 172*a* and 172*b* are then toggled to their respective normal operating positions.

Device 160 is capable of many different modes of operation. Antenna impedance, radio impedance or both may be determined at any time. However, even if only radio impedance is to be determined in a particular operating cycle, switch 172*b* must be toggled from its normal operating position to disconnect the antenna impedance matching circuit and antenna 16 from the radio. Signal processor 98 may generate an antenna impedance matching circuit control signal, a radio impedance matching circuit control signal or both. Where only an antenna impedance matching circuit control signal is to be generated, in applications in which the device does not have a radio impedance matching circuit 152 for example, the reflection characteristics of the actual radio impedance may be used by processor 98 as discussed above to update the stored magnitude and phase information used by the signal processor 98 or to determine an offset between the actual and estimated reflection characteristics.

Figure 17:
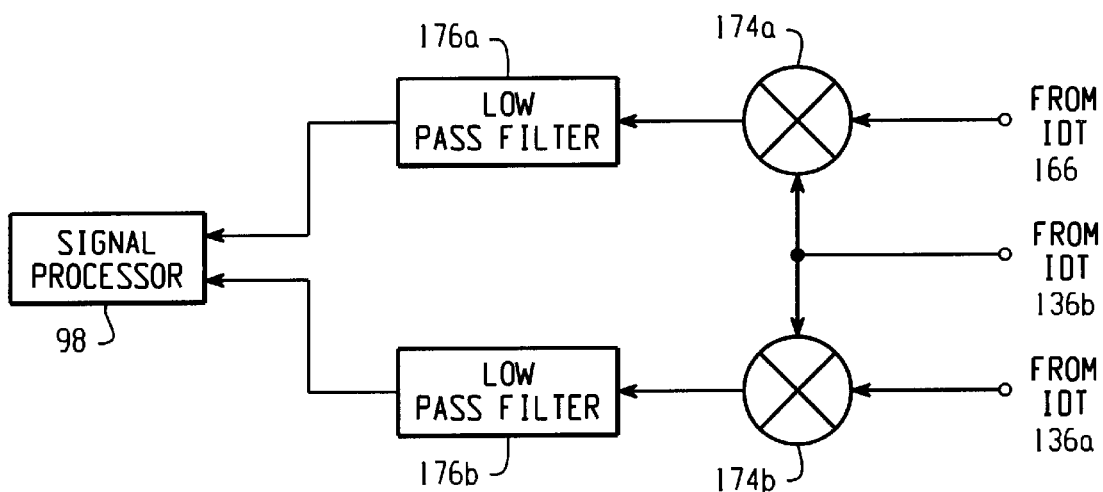
FIG. 17 shows a down conversion arrangement for the fifth embodiment of the invention.

Down conversion of the electrical signal signals from the output IDT 136*a* in FIGS. 14 and 15 can easily be achieved using such an arrangement as shown in FIG. 12. For the triple-track passive SAW device in FIG. 16, output electrical signals from the output IDTs 166 and 136*a* could be simultaneously down converted using two mixers 174*a* and 174*b* and filters 176*a* and 176*b*, as shown in FIG. 17. When this type of down conversion is implemented, signal processor 98 must use stored magnitude and phase reflection characteristics for the known termination 106 in order to determine relevant information from the mixed signal. In reference to FIG. 17, the processor 98 requires down converted versions of the signals from IDTs 166 and 136*a*. The only way the processor 98 can recover such signals from the mixed signals is to access the previously stored magnitude and phase information relating to the signal with which the desired signals were mixed.

One potential problem with this down conversion scheme is that the stored magnitude and phase information and the magnitude and phase of the reference signal actually generated by the IDT connected to the known termination 106 might not be the same. As described above in relation to the impedance of the communication unit 12, temperature and environmental conditions will affect the known termination 106. This can result in a situation in which the stored magnitude and phase no longer accurately represent the actual reference magnitude and phase of the signal generated by the IDT 84*b*. Although IDT 84*b* simplifies down conversion of the output signals generated by the other IDTs in the passive SAW device, if the stored information is not accurate, then any processing performed by processor 98 based on the stored signal will be in error. The IDT/stored information based down conversion is simpler and consumes less power than conventional down conversion techniques in that no local oscillator or frequency synthesizer is required, but is prone to errors caused by variations of the reference.

The effects of such mismatch or offset between the actual and stored reflection characteristics can be minimized by using a stable known termination. For example, an open- or short-circuit termination would tend to be more stable than a resistor. Such attempts to stabilize the known termination 106 would not address potential instability in the reference IDT track 132*b* itself. Since all of the IDT tracks are physically located close to each other and the manufacturing thereof is tightly controlled to ensure that corresponding IDTs in each track are identical, any variations of the reference track IDTs should similarly affect the other IDTs. With respect to phase for example, if a temperature variation affects IDT track 132b to cause the phase of the reflected signal $\phi_r$ to be offset from the stored, expected phase $\phi_s$ by an amount $\phi_o$, where $|\phi_o|=|\phi_r-\phi_s|$, then the phase of each reflected signal generated in each of the other IDT tracks 162 and 132a should have a similar phase offset from expected signal phase. As will be apparent to those skilled in the art, in the down conversion arrangement in FIG. 17, such identical phase offsets will effectively cancel each other in the low-pass filtered signal. IDT track reflection magnitude variations may still cause processing errors, but a stable known termination will at least minimize or ideally eliminate phase processing errors.

Figure 18:
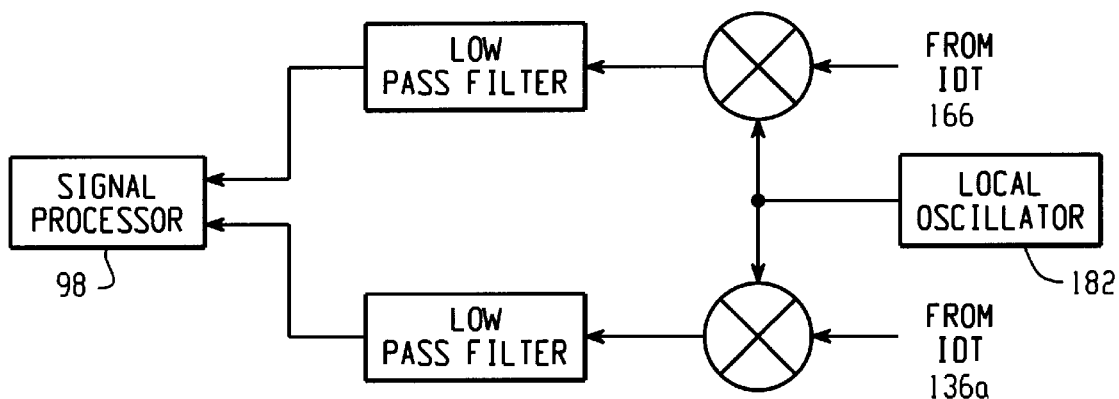
FIG. 18 is a block diagram of an alternative down conversion arrangement for the fifth or a sixth embodiment of the invention.
Figure 19:
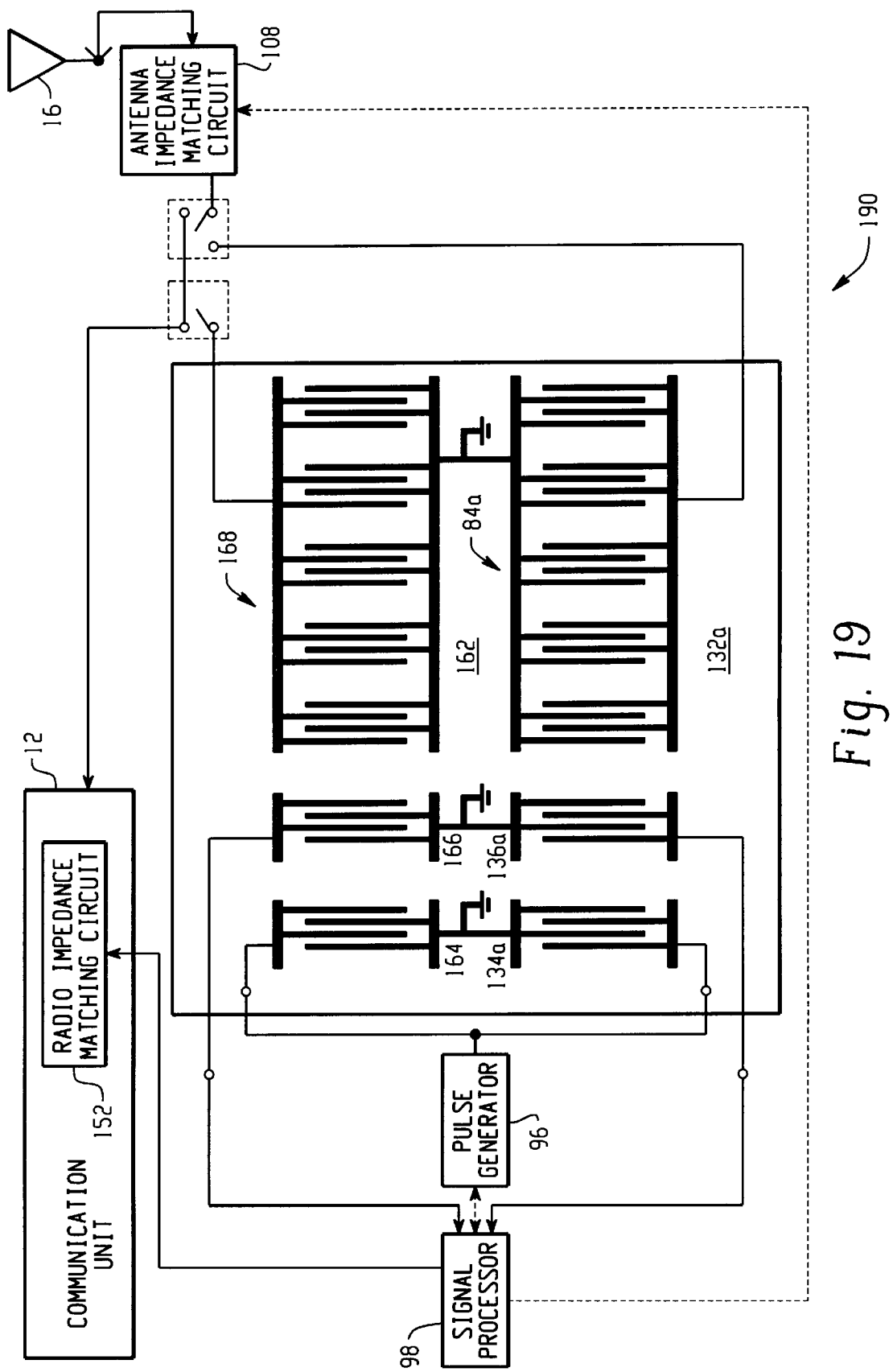
FIG. 19 is a block diagram of a communication device in which a sixth embodiment of the invention is implemented.

If a relatively stable reference signal from a local oscillator or frequency synthesizer is available for down conversion, then a more conventional down conversion scheme as in FIG. 11 could be implemented to overcome both these problems. Magnitude and phase information relating to the reference signal could be stored or otherwise accessible to the processor 98 and should remain accurate, provided that the reference signal is stable. FIG. 18 shows such a down conversion arrangement for simultaneous down conversion of the output electrical signals from IDTs 166 and 136a. With this down conversion arrangement, a dual-track device 190 as shown in FIG. 19 could be implemented.

The communication device 190, including a down conversion arrangement of FIG. 18, should provide for accurate impedance matching. Signals proportional to the actual impedances of the communication unit 12 and the combination of antenna impedance matching circuit 108 and antenna 16 can be compared. Appropriate control signals can then be generated for the antenna impedance matching circuit 108 and/or the radio impedance matching circuit 152, if present. Although the conventional down conversion process assumed in device 190 requires a local oscillator or other frequency synthesis means to generate a reference signal, the reference signal may be available from the communication unit 12, particularly where the IDTs are designed to operate at a communication channel frequency.

In the above embodiments, excitation of the IDT tracks will result in injection of electrical signals into the antenna 16, communication unit 12 or both. For example, in FIG. 19, when the radio and antenna impedances are measured, SAWs generated by input IDTs 164 and 134a will be converted to electrical signals by IDTs 168 and 84a, which signals are input to communication unit 12 and to antenna 16 through impedance matching circuit 108.

If the operating frequency of the IDTs is a communication channel frequency, then the signal injected to the antenna 16 will be radiated over the air. However, excitation of the passive SAW device requires very low power signals, such that any radiated signals will not propagate far from the communication device. Even if such radiated signals are received by another device, the signals are not modulated or coded in accordance with any communication signal modulation or coding schemes which would be used in a system in which the device is designed to operate. Any receiver would therefore be unable to demodulate or decode the radiated signal, which would therefore likely be interpreted as noise. Similarly, the signal injected into the communication unit 12 is unmodulated and uncoded and would therefore also be interpreted as merely a noise signal.

The size of a complete passive SAW device as used in the invention could be on the order of 3 mm square, as will be apparent to those skilled in the art. This would allow the device to be incorporated into small communication devices with limited available space, such as cordless telephones, cellular telephones, communication-enabled personal digital assistants (PDAs), or such hand-held electronic communication devices as described in co-pending U.S. patent application Ser. No. 09/106,585, titled "Hand-Held Electronic Device With a Keyboard Optimized for Use With the Thumbs", the disclosure of which is incorporated into this description by reference. Implementation into other wireless communication devices with less restrictive space constraints, such as wireless modems, is also contemplated. U.S. Pat. No. 5,619,531, titled "Wireless Radio Modem with Minimal Interdevice RF Interference", issued on Apr. 8, 1997, and U.S. Pat. No. 5,764,693, titled "Wireless Radio Modem with Minimal Inter-Device RF Interference", issued on Jun. 9, 1998, both assigned to the assignee of the instant invention and incorporated herein by reference, disclose examples of wireless modems in which implementation of the instant invention is contemplated.

Signal generation and signal processing functions could be implemented using existing communication device processing arrangements, as software code in a DSP for example. Thus, the only additional components required for implementation of the invention in many modern existing communication devices would be the down conversion and switching arrangements. Existing impedance matching circuits would require only the addition of a variable impedance component such as a varactor or the replacement of a fixed impedance with a variable impedance component. Although such retrofitting of existing devices is possible, the invention would be most easily implemented during manufacture of new communication devices.

It will be appreciated that the above description relates to preferred embodiments by way of example only. Many variations on the invention will be obvious to those knowledgeable in the field, and such obvious variations are within the scope of the invention as described and claimed, whether or not expressly described.

For example, the embodiments illustrated in the drawings include single-ended IDTs. Differential and SPUDT-type IDT designs are also contemplated but have not been shown in the drawings in order to avoid congestion. Operating frequency of the IDTs is a design criterion which would be dependent on the particular communication device and communication system in which it operates. Alternative switching arrangements may also be apparent to those skilled in the art and should be considered to be within the scope of the invention. Although not shown in detail in the drawings, the impedance matching circuits 108 and 152 could be of any known matching circuit type or topology, but would include at least one adjustable component.

What is claimed as the invention is:

1. A method for adaptive tuning in a wireless communication device, the method comprising the steps of:

determining magnitude and phase differences between impedance of a matching circuit and an impedance to be matched; and adjusting the impedance of the matching circuit to compensate the differences;

wherein the determining step comprises the steps of:

providing a first interdigital transducer (IDT) track comprising a first input IDT configured to produce a surface acoustic wave (SAW) output when excited by an electrical input signal, a first output IDT configured to produce an electrical output signal when excited by a SAW input, and a first terminated IDT positioned adjacent to the first input IDT and the first output IDT and configured to produce a SAW output when excited by an electrical input signal and an electrical output signal when excited by a SAW input;

providing a first termination circuit connected to the first terminated IDT and causing the first terminated IDT to reflect a SAW toward the first output IDT responsive to a SAW produced by the first input IDT;

applying an electrical input signal to the first input IDT to produce a first SAW; and receiving a first electrical output signal produced by the first output IDT in response to a first reflected SAW produced by the first terminated IDT responsive to the first SAW.

2. The method of claim 1, wherein the determining step further comprises the step of:

processing the first electrical output signal to determine impedance magnitude and phase of the first termination circuit.

3. The method of claim 2, wherein the first termination circuit is the impedance matching circuit, and the determining step further comprises the step of:

comparing the impedance magnitude and phase of the first termination circuit with a predetermined magnitude and phase of the impedance to be matched to thereby determine the magnitude and phase differences.

4. The method of claim 1, wherein the determining step further comprises the steps of:

providing a second IDT track comprising a second input IDT configured to produce a SAW output when excited by an electrical input signal and a second output IDT configured to produce an electrical output signal when excited by a SAW input, and a second terminated IDT positioned adjacent to the second input IDT and the second output IDT and configured to produce a SAW output when excited by an electrical input signal and an electrical output signal when excited by a SAW input;

providing a second termination circuit connected to the terminated IDT and causing the second terminated IDT to reflect a SAW toward the second output IDT responsive to a SAW produced by the second input IDT;

applying an electrical input signal to the second input IDT to produce a second SAW; and receiving a second electrical output signal produced by the second output IDT in response to a second reflected SAW produced by the second terminated IDT responsive to the second SAW.

5. The method of claim 4, wherein the first termination circuit is the impedance matching circuit, the second termination circuit is a reference circuit having known impedance, and the determining step comprises the steps of:

frequency down converting the first electrical signal by:
mixing the first and second electrical output signals to generate a mixed signal; and
low pass filtering the mixed signal to generate a filtered signal; and processing the filtered signal to determine impedance magnitude and phase of the first termination circuit.

6. The method of claim 5, wherein the determining step further comprises the step of:

comparing the impedance magnitude and phase of the first termination circuit with a predetermined magnitude and phase of the impedance to be matched to thereby determine the magnitude and phase differences.

7. The method of claim 4, wherein the first input IDT and the first output IDT comprise a first input/output IDT having first electrical input/output terminals and wherein:

the step of applying an electrical input signal to the first input IDT comprises the step of applying the electrical input signal to the first electrical input/output terminals; and the step of receiving a first electrical output signal comprises the step of receiving the first electrical output signal from the first electrical input/output terminals.

8. The method of claim 7, wherein the second input IDT and the second output IDT comprise a second input/output IDT having second electrical input/output terminals and wherein:

the step of applying an electrical input signal to the second input IDT comprises the step of applying the electrical input signal to the second electrical input/output terminals; and the step of receiving a second electrical output signal comprises the step of receiving the second electrical output signal from the second electrical input/output terminals.

9. The method of claim 4, further comprising the steps of:

providing a third termination circuit; and switchably connecting either the first termination circuit or the third termination circuit to the first terminated IDT.

10. The method of claim 9, wherein the first termination circuit is the impedance matching circuit, the third termination circuit is the impedance to be matched, and the determining step further comprises the steps of:

connecting the first termination circuit to the first terminated IDT;

applying an electrical input signal to the first input IDT to produce the first SAW;

receiving the first electrical output signal;

connecting the third termination circuit to the first terminated IDT;

applying an electrical input signal to the first input IDT to produce a third SAW; and receiving a third electrical output signal produced by the first output IDT in response to a third reflected SAW produced by the first terminated IDT responsive to the third SAW.

11. The method of claim 10, wherein the determining step further comprises the step of:

processing the first and third electrical output signals to determine the magnitude and phase differences.

12. The method of claim 4, wherein the determining step further comprises the steps of:

providing a third IDT track comprising a third input IDT configured to produce a SAW output when excited by an electrical input signal and a third output IDT configured to produce an electrical output signal when excited by a SAW input, and a third terminated IDT positioned adjacent to the third input IDT and the third output IDT and configured to produce a SAW output when excited by an electrical input signal and an electrical output signal when excited by a SAW input;

providing a third termination circuit connected to the terminated IDT and causing the third terminated IDT to reflect a SAW toward the third output IDT responsive to a SAW produced by the third input IDT;

applying an electrical input signal to the third input IDT to produce a third SAW; and receiving a third electrical output signal produced by the third output IDT in response to a third reflected SAW produced by the third terminated IDT responsive to the third SAW.

13. The method of claim 12, wherein the first termination circuit is the impedance matching circuit, the second termination circuit is a reference circuit having known impedance, the third termination circuit is the impedance to be matched, and the determining step comprises the steps of:

frequency down converting the first and third electrical output signals by:
mixing the first and second electrical output signals to generate a first mixed signal;
mixing the second and third electrical output signals to generate a second mixed signal; and
low pass filtering the first and second mixed signals to respectively generate a first filtered signal and a second filtered signal; and processing the first filtered signal and the second filtered signal to determine the magnitude and phase differences.

14. The method of claim 4, wherein the first termination circuit is the impedance matching circuit, the second termination circuit is the impedance to be matched, and the determining step comprises the steps of:

processing the first electrical output signal to determine impedance magnitude and phase of the first termination circuit;

processing the second electrical output signal to determine impedance magnitude and phase of the second termination circuit; and comparing the impedance magnitude and phase of the first termination circuit and the impedance magnitude and phase of the second termination circuit to determine the magnitude and phase differences.

15. An adaptive tuning system in a communication device, the adaptive tuning system comprising:
a passive surface acoustic wave (SAW) device;
means for supplying an electrical input signal to excite the passive SAW device;
means for processing electrical output signals produced by the SAW device responsive to the electrical input signals to generate a control signal; and
an adjustable impedance matching circuit connected to receive the control signal, the impedance of the impedance matching circuit being dependent upon the control signal.

16. The system of claim 15, wherein the passive SAW device comprises a first interdigital transducer (IDT) track, the first track including:
a first input IDT configured to produce a SAW output when excited by an electrical input signal;
a first output IDT configured to produce an electrical output signal when excited by a SAW input;
a first terminated IDT positioned adjacent to the first input IDT and the first output IDT and configured to produce a SAW output when excited by an electrical input signal and to produce an electrical output signal when excited by a SAW input; and
a first termination circuit connected to the first terminated IDT and causing the first terminated IDT to reflect a SAW toward the first output IDT responsive to a SAW produced by the first input IDT, the magnitude and phase of the reflected SAW being dependent on the first termination circuit.

17. The system of claim 16, wherein:
the first input IDT produces a first SAW in response to an electrical input signal from the means for supplying; and
the first output IDT produces a first electrical output signal in response to a first reflected SAW produced by the first terminated IDT responsive to the first SAW.

18. The system of claim 17, wherein the first termination circuit comprises the adjustable impedance matching circuit, and the means for processing generates the control signal based on a comparison between the first electrical output signal and a predetermined signal.

19. The system of claim 18, wherein the predetermined signal is dependent upon an impedance to be matched by the impedance matching circuit.

20. The system of claim 17, further comprising a frequency down converter, the converter comprising:
an oscillator for generating a reference frequency signal;
a mixer for mixing the first electrical output signal and the reference frequency signal to generate a mixed signal; and
a low pass filter for filtering the mixed signal to generate a down converted signal,
wherein the means for processing generates the control signal based on the down converted signal.

21. The system of claim 17, wherein the passive SAW device further comprises a second IDT track, the second track including:
a second input IDT configured to produce a SAW output when excited by an electrical input signal;
a second output IDT configured to produce an electrical output signal when excited by a SAW input;
a second terminated IDT positioned adjacent to the second input IDT and the second output IDT and configured to produce a SAW output when excited by an electrical input signal and to produce an electrical output signal when excited by a SAW input; and
a second termination circuit connected to the second terminated IDT and causing the second terminated IDT to reflect a SAW toward the second output IDT responsive to a SAW produced by the second input IDT, the magnitude and phase of the reflected SAW being dependent on the second termination circuit.

22. The system of claim 21, wherein the second termination circuit is a known impedance.

23. The system of claim 22, wherein the known impedance is an impedance to be matched by the impedance matching circuit.

24. The system of claim 21, wherein the second termination circuit is an unknown impedance to be matched by the impedance matching circuit.

25. The system of claim 21, wherein the first input IDT and the first output IDT comprise a first input/output IDT and the second input IDT and the second output IDT comprise a second input/output IDT.

26. The system of claim 21, wherein the adjustable impedance matching circuit is operatively connected to an antenna.

27. The system of claim 21, wherein the first termination circuit is switchably connected to the first terminated IDT in the first IDT track.

28. The system of claim 27, wherein one of a plurality of different termination circuits may be switchably connected to the first terminated IDT.

29. The system of claim 28, wherein the plurality of different termination circuits includes the impedance matching circuit and an impedance to be matched by the impedance matching circuit.

30. The system of claim 21, further comprising frequency down conversion means operatively connected between the first and second output IDTs and the means for processing, wherein the down conversion means comprises:

oscillator means for generating a reference signal;

a first mixer having inputs connected to receive the reference signal and the first electrical output signal;

a second mixer having inputs connected to receive the reference signal and the second electrical output signal;

a first low pass filter having an input connected to the first mixer and an output connected to the means for processing; and a second low pass filter having an input connected to the second mixer and an output connected to the means for processing.

31. The system of claim 21, wherein the passive SAW device further comprises a third IDT track, the third track including:

a third input IDT configured to produce a SAW output when excited by an electrical input signal;

a third output IDT configured to produce an electrical output signal when excited by a SAW input;

a third terminated IDT positioned adjacent to the third input IDT and the third output IDT and configured to produce a SAW output when excited by an electrical input signal and to produce an electrical output signal when excited by a SAW input; and a third termination circuit connected to the third terminated IDT and causing the third terminated IDT to reflect a SAW toward the third output IDT responsive to a SAW produced by the third input IDT, the magnitude and phase of the reflected SAW being dependent on the third termination circuit.

32. The system of claim 31, wherein:

the second input IDT produces a second SAW in response to an electrical input signal from the means for supplying;

the second output IDT produces a second electrical output signal in response to a second reflected SAW produced by the second terminated IDT responsive to the second SAW;

the third input IDT produces a third SAW in response to an electrical input signal from the means for supplying; and the third output IDT produces a third electrical output signal in response to a third reflected SAW produced by the third terminated IDT responsive to the third SAW.

33. The system of claim 32, wherein the means for processing generates the control signal based on a comparison between the first and third electrical output signals.

34. The system of claim 33, further comprising down conversion means, the down conversion means comprising:

a first mixer having inputs connected to receive the first and second electrical output signals;

a second mixer having inputs connected to receive the second and third electrical output signals;

a first low pass filter having an input connected to the first mixer and an output connected to the means for processing; and a second low pass filter having an input connected to the second mixer and an output connected to the means for processing.

35. The system of claim 32, wherein each IDT is configured to operate at a predetermined frequency equal to a frequency at which the communication device sends or receives communication signals.

36. The system of claim 15, wherein the communication device is a cordless telephone.

37. The system of claim 15, wherein the communication device is a mobile communication device.

38. The system of claim 37, wherein the communication device is a cellular telephone.

39. The system of claim 15, wherein the communication device is a wireless modem.

40. The system of claim 15, wherein the communication device is a hand-electronic device.

41. The system of claim 15, wherein the communication device is a pager.

42. The system of claim 15, wherein the communication device is a personal digital assistant (PDA).

* * * * *

UNITED STATES PATENT AND TRADEMARK OFFICE
CERTIFICATE OF CORRECTION

PATENT NO. : 6,570,462 B2
DATED : May 27, 2003
INVENTOR(S) : Peter J Edmonson and Colin K. Campbell It is certified that error appears in the above-identified patent and that said Letters Patent is hereby corrected as shown below:

<u>Column 24,</u>
Line 37, please replace "hand-electronic" with -- hand-held electronic --

Signed and Sealed this

Ninth Day of September, 2003

JAMES E. ROGAN
*Director of the United States Patent and Trademark Office*